(12) United States Patent
Kong et al.

(10) Patent No.: US 6,590,226 B2
(45) Date of Patent: Jul. 8, 2003

(54) THIN FILM TRANSISTOR ARRAY SUBSTRATE, METHOD FOR MANUFACTURING THE SAME AND SYSTEM FOR INSPECTING THE SUBSTRATE

(75) Inventors: Hyang-Shik Kong, Suwon (KR); Sung-Wook Huh, Seoul (KR); Young-Bae Park, Yongin (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/970,785

(22) Filed: Oct. 5, 2001

(65) Prior Publication Data
US 2002/0053701 A1 May 9, 2002

(30) Foreign Application Priority Data
Nov. 7, 2000 (KR) ........................................ 2000-65860

(51) Int. Cl.⁷ ..................... H01L 29/04; H01L 31/036; H01L 31/0376
(52) U.S. Cl. .......................................... 257/59; 257/72
(58) Field of Search ............................... 257/48, 57, 59, 257/61, 72; 438/158, 29–30, 149, 151, 155, 157–161, 166; 349/43, 122, 155

(56) References Cited

U.S. PATENT DOCUMENTS 5,883,682 A * 3/1999 Kim et al. .................. 349/43
5,990,986 A * 11/1999 Song et al. .................. 349/43
6,022,753 A * 2/2000 Park et al. .................. 438/30
6,038,003 A * 3/2000 Kim .............................. 349/43

FOREIGN PATENT DOCUMENTS

JP 7-106382 * 4/1995 ........... H01L/21/66

* cited by examiner

Primary Examiner—Shouxiang Hu
(74) Attorney, Agent, or Firm—McGuire Woods LLP; Hae-Chan Park

(57) ABSTRACT

Disclosed is a thin film transistor substrate and a system for inspecting the same. The thin film transistor substrate comprises gate wiring formed on an insulation substrate and including gate lines, and gate electrodes and gate pads connected to the gate lines; a gate insulation layer covering the gate wiring; a semiconductor layer formed over the gate insulation layer; data wiring formed over the gate insulation layer and including data pads; a protection layer covering the data wiring; auxiliary pads connected to the data pads through contact holes formed in the protection layer; and a pad auxiliary layer formed protruding a predetermined height under the data pads. The inspection system for determining whether a thin film transistor substrate is defective, in which the thin film transistor substrate comprises gate wiring including gate lines, gate electrodes and gate pads, and data wiring including source electrodes and drain electrodes, includes a probe pin for contacting the gate pads or data pads and transmitting a corresponding signal, wherein a contact tip at a distal end of the probe pin for contacting the gate pads or the data pads is rounded, and a radius of the rounded contact tip is 2 μm or less, or the rounded contact tip is coated with gold (Au).

9 Claims, 34 Drawing Sheets

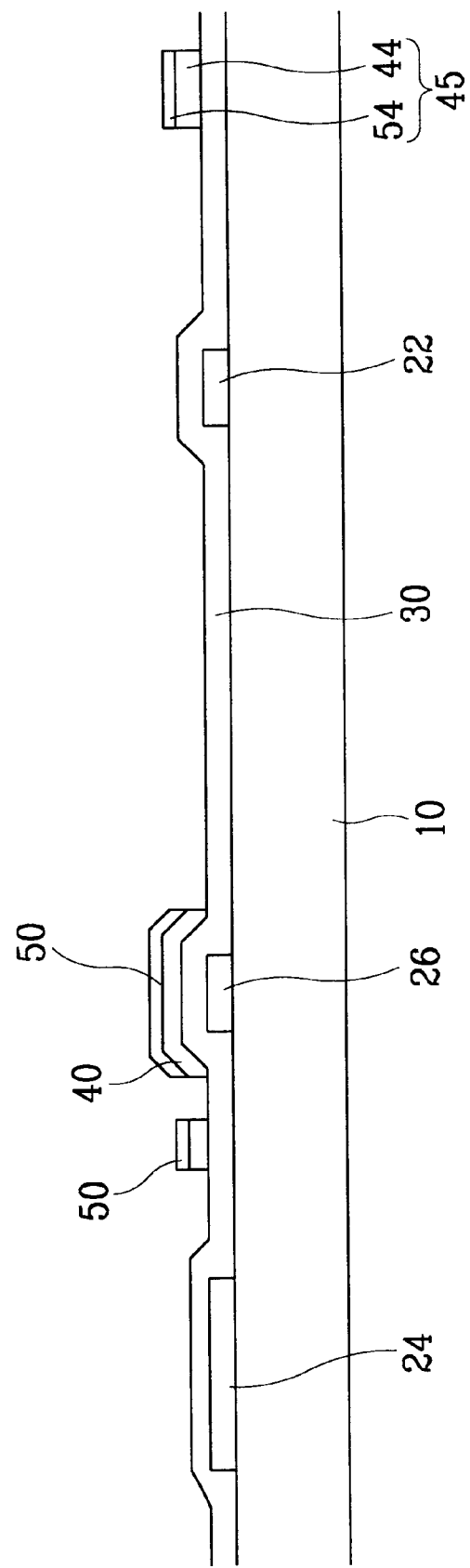

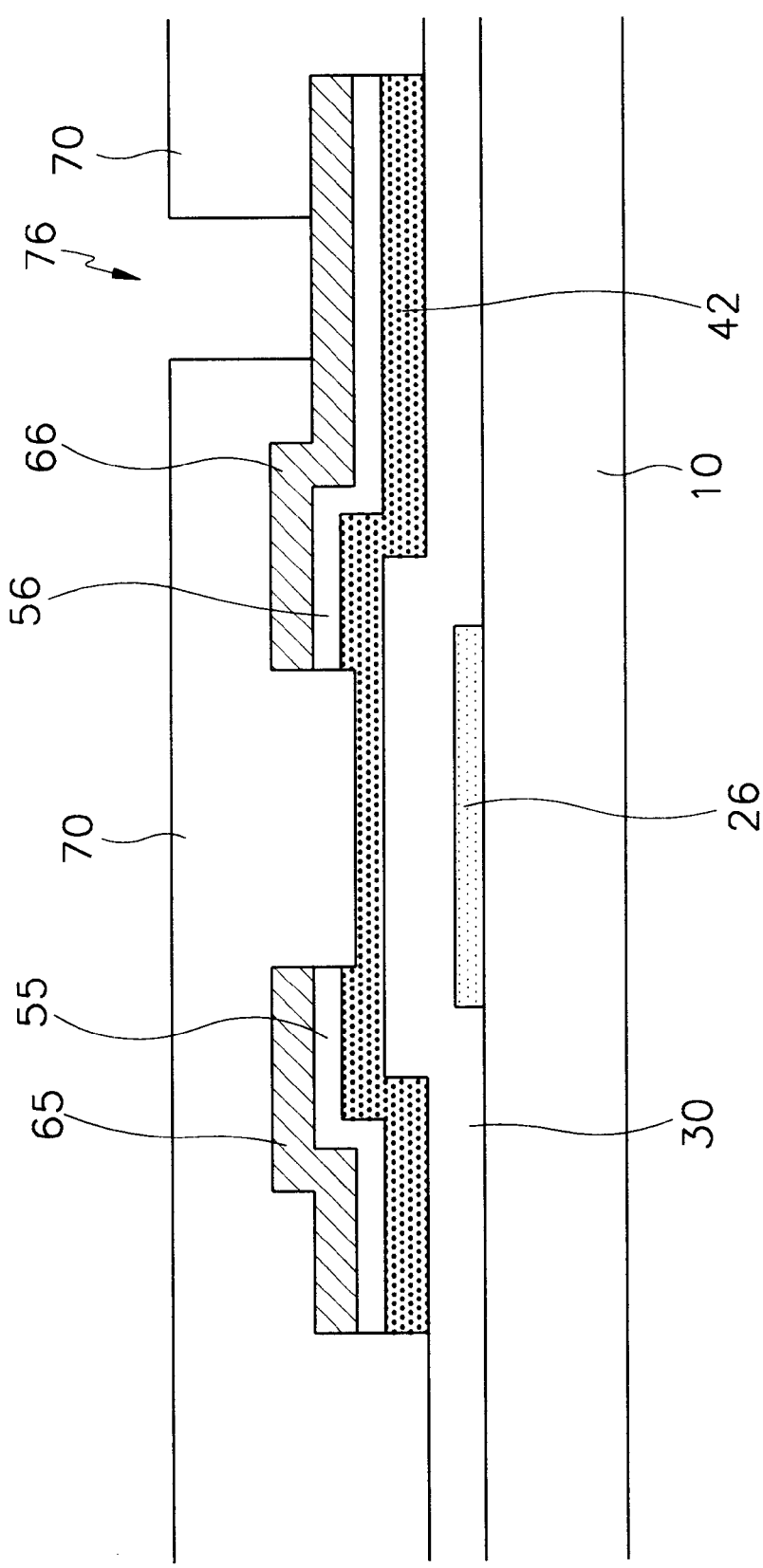

THIN FILM TRANSISTOR ARRAY SUBSTRATE, METHOD FOR MANUFACTURING THE SAME AND SYSTEM FOR INSPECTING THE SUBSTRATE

BACKGROUND OF THE INVENTION (a) Field of the Invention

The present invention relates to a thin film transistor array substrate. More particularly, the present invention relates to a thin film transistor array substrate, a method for manufacturing the same and a system for inspecting the substrate.

(b) Description of the Related Art

Liquid crystal displays are at present the most commonly used flat panel display. The liquid crystal display (LCD) is structured having liquid crystal material injected between two substrates. Voltages of different potentials are applied to electrodes of the substrates to form electric fields such that the alignment of liquid crystal molecules of the liquid crystal material is varied. Accordingly, the transmittance of incident light is controlled to enable the display of images.

Formed on one of the substrates is wiring, which transmits image signals and scanning signals. The wiring defines pixels in a matrix arrangement, and each pixel is electrically connected to the wiring. Formed on the same substrate as the wiring are thin film transistors (TFTs) for discontinuing the transmittance of the image signals, and pixel electrodes for transmitting the image signals. This substrate is referred to as a TFT substrate.

Pads are connected to ends of the wiring. The pads are used as a means to transmit the scanning signals and image signals to the wiring from an external drive circuit. To prevent damage to the pads, it is preferable to cover the pads with auxiliary pads made of a conducting material in another layer.

However, a space between the pads decreases as the resolution of the LCD increases. Thus, contact defects of a probe pin used in inspecting the liquid crystal panel increases contact resistance of the pads. This is particularly true when IZO (indium zinc oxide), which has a high surface contact resistance, is used for the auxiliary pads, making it unable to inspect the liquid crystal panel.

SUMMARY OF THE INVENTION

The present invention has been made in an effort to solve the above problems.

It is an object of the present invention to provide a thin film transistor array substrate, a method for manufacturing the same, and a system for inspecting the substrate that lowers a contact resistance with a probe pin.

To achieve the above object, the present invention provides a thin film transistor substrate comprising gate wiring formed on an insulation substrate and including gate lines, and gate electrodes and gate pads connected to the gate lines; a gate insulation layer covering the gate wiring; a semiconductor layer formed over the gate insulation layer; data wiring formed over the gate insulation layer and including data pads; a protection layer covering the data wiring; auxiliary pads connected to the data pads through contact holes formed in the protection layer; and a pad auxiliary layer formed protruding a predetermined height under the data pads.

According to a feature of the present invention, the pad auxiliary layer is formed on a same layer as the semiconductor layer.

According to another feature of the present invention, the pad auxiliary layer is formed on a same layer as the gate wiring.

According to yet another feature of the present invention, the data wiring further includes data lines, source electrodes connected to the data lines, and drain electrodes provided opposing the source electrodes with respect to the gate electrodes.

According to still yet another feature of the present invention, the substrate further comprises pixel electrodes formed on a same layer as the auxiliary pads and connected to the drain electrodes.

According to still yet another feature of the present invention, the substrate further comprises an ohmic contact layer formed between the semiconductor layer and the data wiring, the ohmic contact layer being doped with impurities at a high concentration.

According to still yet another feature of the present invention, the ohmic contact layer is formed in the same shape as the data wiring.

According to still yet another feature of the present invention, the semiconductor layer, except for a channel formed between the source electrodes and the drain electrodes, is formed in the same shape as the data wiring.

According to still yet another feature of the present invention, the pad auxiliary layer is made of an aluminum group conducting material, the auxiliary pads are made of IZO, and the pad auxiliary layer and the auxiliary pads are interconnected via the contact holes of the data pads.

In another aspect, the present invention provides a thin film transistor comprising gate wiring formed on an insulation substrate and including gate lines, and gate electrodes and gate pads connected to the gate lines; a gate insulation layer covering the gate wiring; a semiconductor layer formed over the gate insulation layer; data wiring formed over the gate insulation layer and including data lines, source electrodes connected to the data lines, drain electrodes provided opposing the source electrodes with respect to the gate electrodes, and data pads connected to the data lines; a protection layer covering the data wiring; and pixel electrodes connected to the drain electrodes through contact holes formed on the protection layer, wherein the protection layer or the gate insulation layer is removed at pad portions where the data pads are formed such that at least the data pads are fully exposed.

According to a feature of the present invention, the thin film transistor further comprises auxiliary pads formed on a same layer as the pixel electrodes and covering the data pads.

The inspection system for determining whether a thin film transistor substrate is defective, in which the thin film transistor substrate comprises gate wiring including gate lines, gate electrodes and gate pads, and data wiring including source electrodes and drain electrodes, includes a probe pin for contacting the gate pads or data pads and transmitting a corresponding signal, wherein a contact tip at a distal end of the probe pin for contacting the gate pads or the data pads is rounded, and a radius of the rounded contact tip is 2 $\mu$m or less, or the rounded contact tip is coated with gold (Au).

BRIEF DESCRIPTION OF THE DRAWINGS

The accompanying drawings, which are incorporated in and constitute a part of the specification, illustrate an embodiment of the invention, and, together with the description, serve to explain the principles of the invention:

FIG. 9B is a sectional view taken along line IXb–IXb' of FIG. 9A, and it shows a step following that depicted in FIG. 8B;

FIGS. 21B and 21C are sectional views taken along line XXIb–XXIb' and XXIc–XXIc', respectively, of FIG. 21A;

DETAILED DESCRIPTION OF THE PREFERRED EMBODIMENTS

Preferred embodiments of the present invention will now be described in detail with reference to the accompanying drawings.

In the preferred embodiments of the present invention, in order to determine whether a completed thin film transistor (TFT) substrate is defective, a probe pin is contacted to gate pads of gate wiring or data pads of data wiring. Since the number of data wires and data pads for transmitting image signals increases as the resolution of an LCD increases, misalignment between the pads and probe pin frequently occurs. This increases contact resistance between the pads and probe pin, making it difficult to perform the test defects of the TFT substrate. To solve this problem, the present invention uses a probe pin having a tip (contact portion) that is rounded, and a radius of the rounded tip is 2 $\mu$m or less. This will be described in more detail below.

Figure 1:
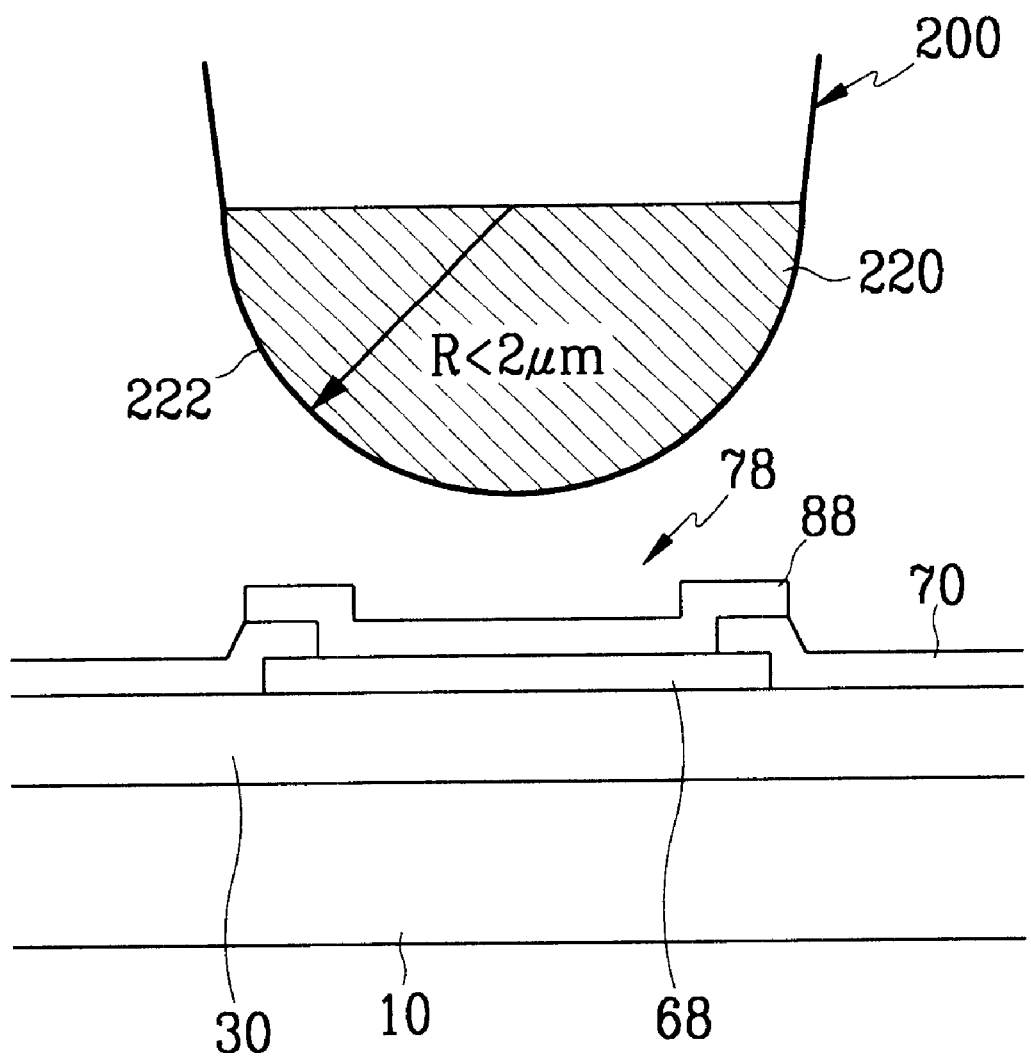
FIG. 1 is a schematic view for describing a step in inspecting a thin film transistor array substrate for a liquid crystal display according to a preferred embodiment of the present invention.

FIG. 1 shows a schematic view for describing a step in inspecting a thin film transistor array substrate for a liquid crystal display according to a preferred embodiment of the present invention.

In a completed TFT substrate, typically a gate insulation layer 30 is formed on an insulation substrate 10, and a data pad 68 (only a single data pad 68 is shown in the partial view of FIG. 1) is provided on the gate insulation layer 30, the data pad 68 being connected to a data wire (not shown). Formed over the data pad 68 is a protection layer 70, and a contact hole 78 is formed in the protection layer 70 to expose the data pad 68. An auxiliary data pad 88 made of, for example, an IZO layer is formed over the contact hole 78 and partially overlaps the protection layer 70. As a result, the auxiliary data pad 88 contacts the data pad 68 via the contact hole 78.

To determine if the TFT substrate is defective, a probe pin 200 of an inspection system is contacted to the auxiliary data pad 88. If during this process misalignment occurs between the probe pin 200 and the auxiliary data pad 88, a contact tip 220 of the probe pin 200 nevertheless comes to contact the auxiliary data pad 88 as a result of a stepped portion formed by the contact hole 78 of the protection layer 70. However, a contact resistance between the auxiliary data pad 88 and the contact tip 220 increases. If the contact tip 220 of the probe pin 200 is provided in a curved shape with a radius of the curve at 2 $\mu$m or less, the contact tip 220 of the probe pin 200 contacts an outer surface of the auxiliary data pad 88, which is in direct contact with the data pad 68, in such a manner as to minimize the contact resistance between the contact tip 220 and the auxiliary data pad 88. As a result, a more precise determination of the defectiveness of the TFT substrate is realized. To further reduce contact resistance between the contact tip 220 and the auxiliary data pad 88, it is possible to coat the contact tip 220 with gold (Au) or other such materials that have a low resistance.

As examples of alternative methods, it is possible to (a) form a pad portion, which includes the data pad, in a convex shape; (b) form a pad auxiliary layer on a layer identical to a semiconductor layer at a center portion of the data pad in order to increase an area that the probe pin contacts; or (c) remove the insulation layer on the pad portion such that the data pad is exposed. Further, a pad auxiliary layer may be inserted under the data pad of a low-resistance aluminum group material, after which the pad auxiliary layer is connected to an IZO auxiliary pad.

Figure 2:
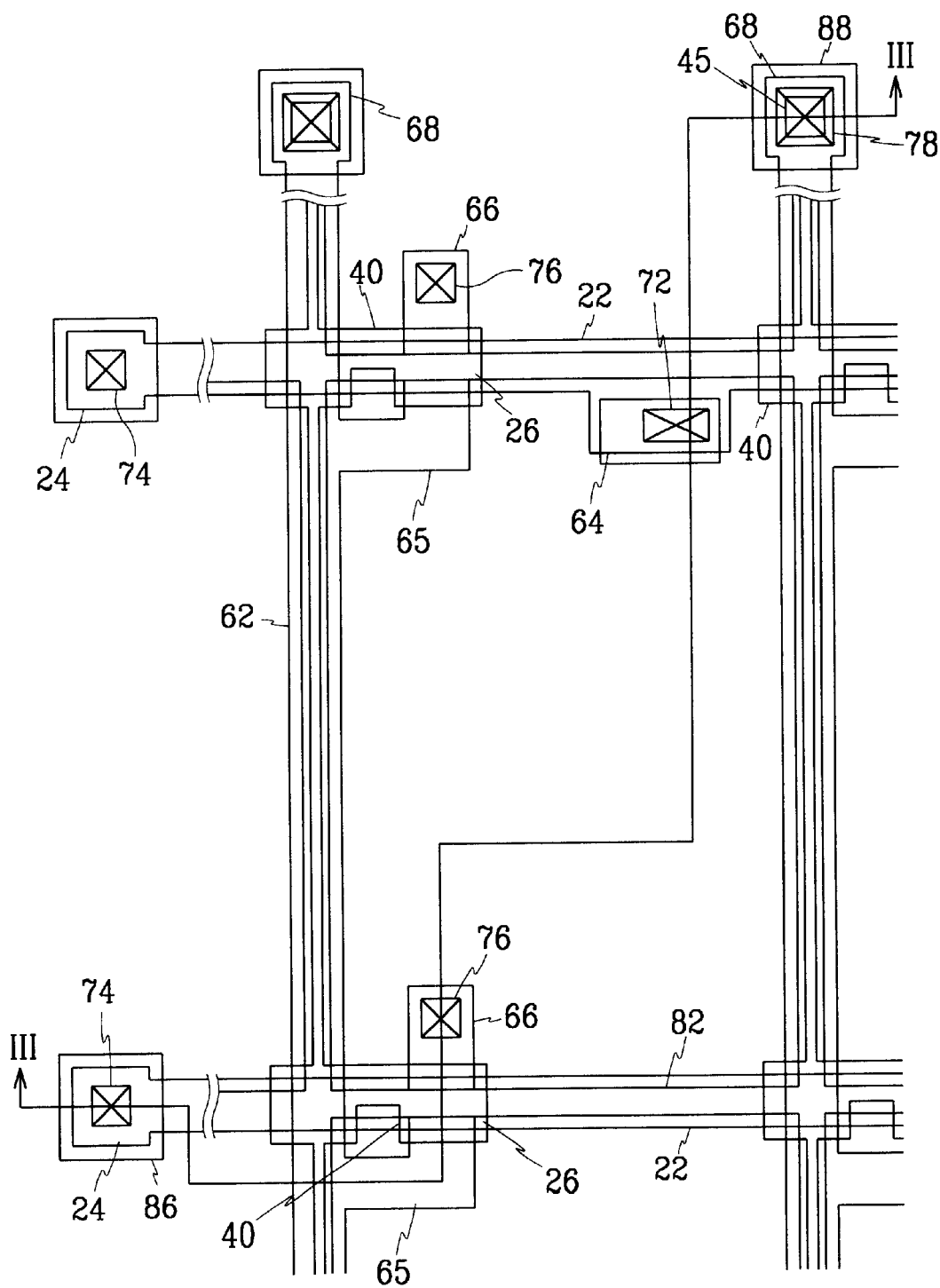
FIG. 2 is a schematic view of a thin film transistor substrate for a liquid crystal display according to a first preferred embodiment of the present invention.
Figure 3:
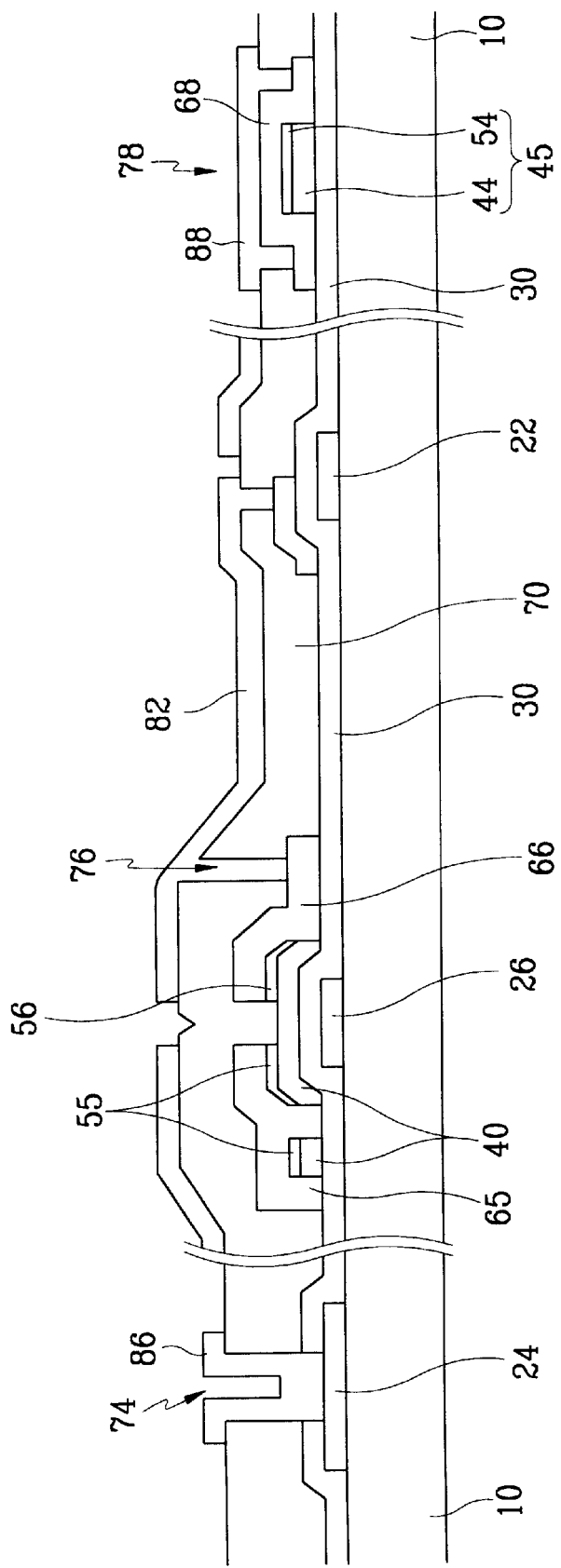
FIG. 3 is a sectional view taken along line III–III' of FIG. 2.

FIG. 2 shows a schematic view of a thin film transistor substrate for a liquid crystal display according to a first preferred embodiment of the present invention, and FIG. 3 shows a sectional view taken along line III–III' of FIG. 2. The drawings show only a section of the substrate. It is to be assumed that many of the elements described are formed a plurality of times over the substrate.

Gate wiring is formed on an insulation substrate. The gate wiring is made of an aluminum group metal having a low resistance. The gate wiring includes gate lines 22 formed horizontally (in FIG. 2) and gate pads 24 connected to ends of the gate lines 22. The gate pads 24 receive gate signals and transmit the gate signals to the gate lines 22. The gate wiring also includes gate electrodes 26 of thin film transistors. The gate electrodes 26 are connected to the gate lines 22.

A gate insulating layer 30 covers the gate wiring. The gate insulating layer 30 is made of a material such as $SiN_x$. A semiconductor layer 40 is formed over the gate insulating layer 30 at areas corresponding to and in the vicinity of the gate electrodes 26. The semiconductor layer 40 is made of a semiconductor material such as amorphous silicon. Ohmic contact layers 55 and 56 are formed over the semiconductor layer 40. The ohmic contact layers 55 and 56 are made of a material such as n+amorphous silicon hydride, which is doped with n-type impurities at a high concentration. Further, a pad auxiliary layer 45, comprised of amorphous silicon layers 44 and 54, is formed at predetermined locations over that gate insulation layer 30. The pad auxiliary layer 45 is made on the same layer as the semiconductor layer 40 or the ohmic contact layers 55 and 56.

Data wiring is formed over the gate insulation layer 30 and the ohmic contact layers 55 and 56. The data wiring is made of a metal such as molybdenum (Mo) or a molybdenum-tungsten (MoW) alloy, chrome (Cr), tantulum (Ta), and titanium (Ti). The data wiring includes data lines 62 formed vertically (in FIG. 2) intersecting the gate lines 22 to thereby define pixels and source electrodes 65 branched from the data lines 62 and extending to cover the ohmic contact layer 55. The data wiring includes drain electrodes 66 separated from the source electrodes 65 and formed over the ohmic contact layer 56 on a side opposite the source electrodes 65 with respect to the gate electrodes 26. Also included in the data wiring are data pads 68 connected to one end of the data lines 62 and formed covering the pad auxiliary layer 45, the data pads 68 receiving image signals.

In the case where the elements 62, 65, 66 and 68 of the data wiring are formed in two or more layers, it is preferable that one layer is formed of a conducting material such as a low resistance aluminum group material, and another layer is made of a material that has good contact properties with the first material, for example, Cr/Al (or an aluminum alloy) or Al/Mo, etc.

A protection layer 70, which is made of $SiN_x$, is formed over the data wiring and over portions of the semiconductor layer 40 not covering the data wiring. Contact holes 76 and 78 respectively exposing the drain electrodes 66 and the data pads 68, and a contact hole 74 exposing the gate insulation layer 30 and the gate pads 24 are formed in the protection layer 70. The contact holes 74 and 78 that expose the gate pads 24 and the data pads 68, respectively, can be formed having angles or in a circular shape, and have an area that does not exceed 2 mm×60 μm but preferably at least 0.5 mm×15 μm. Further, the contact hole 78 is preferably larger than the pad auxiliary layer 45.

Pixel electrodes 82 are formed on the protection layer 70 and are electrically connected to the drain electrodes 66 via the contact hole 76. Further, auxiliary gate pads 86 and auxiliary data pads 88 respectively connecting the gate pads 24 via that contact holes 74 and the data pads 68 via the contact holes 78 are formed on the protection layer 70. The pixel electrodes 82 and the auxiliary gate and data pads 86 and 88 are made of IZO (indium zinc oxide). With the formation of the pad auxiliary layer 45 under the data pads 68, the auxiliary data pads 88 are substantially flat. Accordingly, no stepped region is formed by the protection layer 70 such that the area of contact between the contact tip 220 of the probe pin 200 (see FIG. 1) and the auxiliary data pad 88 is increased. Therefore, contact resistance between the auxiliary pads 88 and the contact tip 220 of the probe pin 200 is minimized during testing of the substrate.

The TFT array substrate of the first embodiment of the present invention has a contact structure between the gate pads 24, which are made of an aluminum group metal, and the auxiliary gate pads 86, which are made of IZO. The contact resistance of this contact structure is 10% or less with respect to the elements 22, 24 and 26 of the gate wiring, and is preferably at or less than 0.15Ω·cm². In a 14.1-inch liquid crystal panel, a contact resistance of the pad portions is within the range of 0.05~0.1Ω·cm².

The pixel electrodes 82, with reference to FIGS. 1 and 2, overlap the gate lines 22 to form a storage capacitor. When a storage capacitance is insufficient, a storage capacitance wiring can be added to the same layer as the elements 22, 24 and 26 of the gate wiring. Further, the pixel electrodes 82, auxiliary gate pads 86, and auxiliary data pads 88 may be formed before the protection layer 70, and may also be formed before the elements 62, 65, 66 and 68 of the data wiring.

With the structure as described above, the elements 22, 24 and 26 of the gate wiring are made of a low-resistance aluminum group material such that it can be applied to a large-screen, high resolution LCD. Also, this enables the contact resistance of the pad portions to be minimized and prevents corrosion.

In addition, with the formation of the pad auxiliary layer 45, the auxiliary data pads 88 are formed in a flat or protruded shape such that the area of contact for the probe pin 200 is increased, thereby preventing contact defects and limiting the contact resistance between the probe pin 200 and the auxiliary data pads 88 during panel testing in the LCD manufacturing process. The pad auxiliary layer 45 may be formed on the same layer as the elements 22, 24 and 26 of the gate wiring.

As a method of forming the pad portions in a protruded shape, the gate insulation layer 30 and the protection layer 70 of the pad portions, where the data pads 68 are provided, are removed. This will be described in more detail with reference to the drawings. With the exception of the pad portions, the structure to be described is identical to that of the first preferred embodiment of the present invention. Accordingly, like reference numerals will be used for like elements and a detailed description of identical elements will not be provided.

Figure 4:
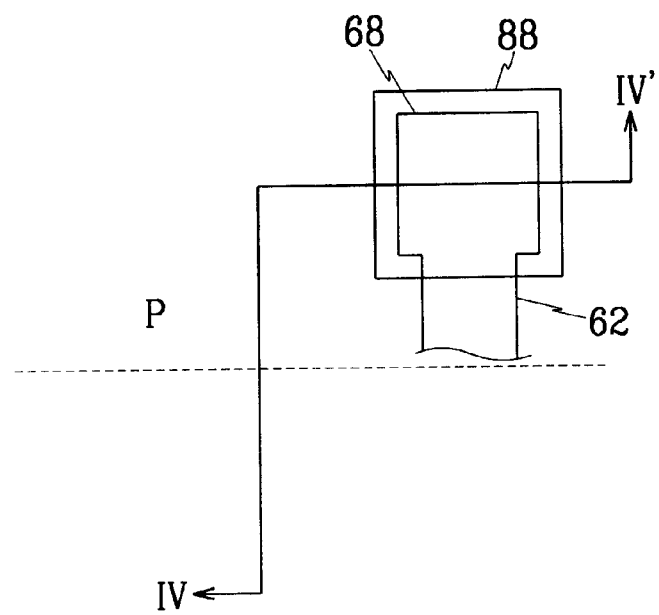
FIG. 4 is a schematic view of a data pad in a thin film transistor substrate for a liquid crystal display according to a second preferred embodiment of the present invention.
Figure 5:
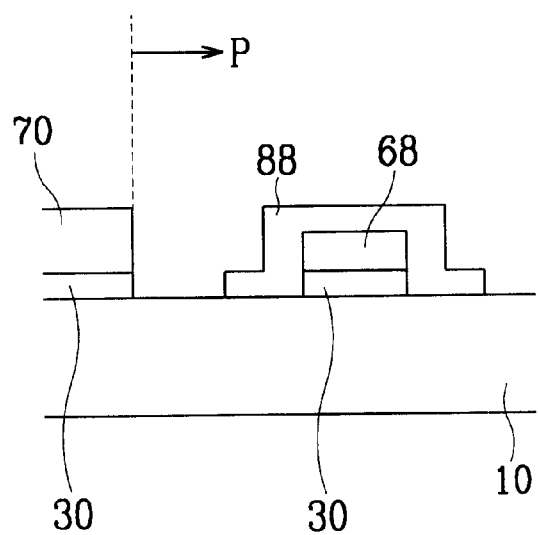
FIG. 5 is a sectional view taken along line V–V' of FIG. 4.

FIG. 4 shows a schematic view of a data pad in a thin film transistor substrate for a liquid crystal display according to a second preferred embodiment of the present invention, and FIG. 5 shows a sectional view taken along line V–V' of FIG. 4.

The gate insulation layer 30 and the protection layer 70 are removed from a specific portion P of the pad portions where the data pads 68 are formed, except for an area under the data pads 68 where the gate insulation layer 30 is left remaining. The auxiliary data pads 88 fully cover the data pads 68 and extend a predetermined distance over the substrate 10. As a result, the auxiliary data pads 88 are formed in a protruding manner. The same effects as with the first embodiment are achieved with this structure.

In another structure, a low-resistance pad auxiliary layer may be provided on the same layer as the elements 22, 24 and 26 of the gate wiring as described above. With the exception of the pad portions, this structure, which will be described below, is identical to that of the first preferred embodiment of the present invention. Accordingly, like reference numerals will be used for like elements and a detailed description of identical elements will not be provided.

Figure 6:
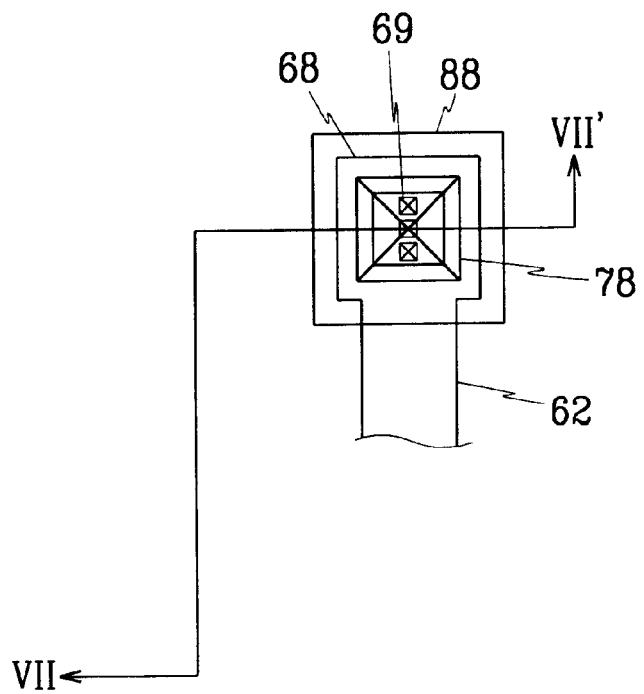
FIG. 6 is a schematic view of a data pad in a thin film transistor substrate for a liquid crystal display according to a third preferred embodiment of the present invention.
Figure 7:
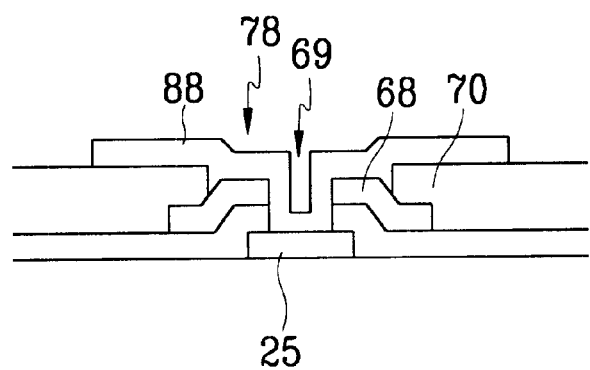
FIG. 7 is a sectional view taken along line VII–VII' of FIG. 6.

FIG. 6 shows a schematic view of a data pad in a thin film transistor substrate for a liquid crystal display according to a third preferred embodiment of the present invention, FIG. 7 shows a sectional view taken along line VII–VII' of FIG. 6.

Pad auxiliary layers 25, which are made of an aluminum group conducting material, are formed on the same layer as the elements 22, 24 and 26 of the gate wiring. The data pads 68 are formed over the gate insulation layer 30, which covers the pad auxiliary layers 25. Contact holes 69 are formed in the data pads 68 and the gate insulation layer 30 such that the pad auxiliary layers 25 are exposed. The contact holes 69 may be cylindrical or rectangular, and may be formed having a plurality of rows and columns. The data pads 68 are partially covered by the protection layer 70. That is, contact holes 78 formed in the protection layer 70 are larger than the contact holes 69 of the data pads 68 such that the data pads 68 are only partially covered by the protection layer 70.

The auxiliary data pads 88 are formed covering the above structure such that the auxiliary data pads 88 contact the data pads 68 and the pad auxiliary layers 25. As a result, a pad portion structure with a low contact resistance is achieved to minimize the contact resistance with the probe pin.

A method for manufacturing the TFT substrate for an LCD according to first preferred embodiment of the present invention will now be described with reference to FIGS. 2 and 3, and FIGS. 8A through 11B. Manufacturing methods of the TFT substrate according to the second and third preferred embodiments of the present invention will also be described.

Figure 8A:
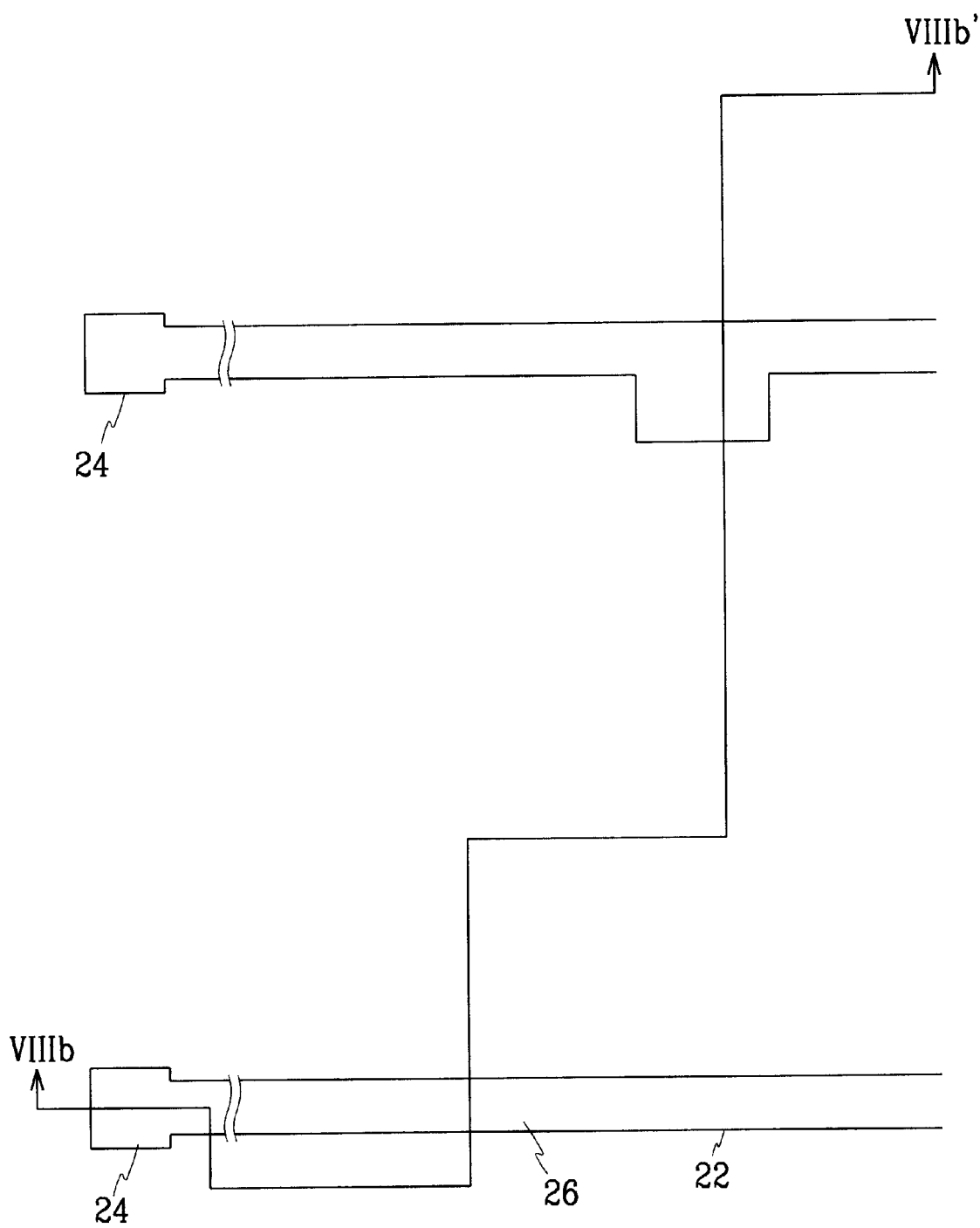
FIGS. 8A, 9A, 10A and 11A are schematic views sequentially illustrating an intermediate process in the manufacturing of a thin film transistor substrate for a liquid crystal display according to a first preferred embodiment of the present invention.
Figure 8B:
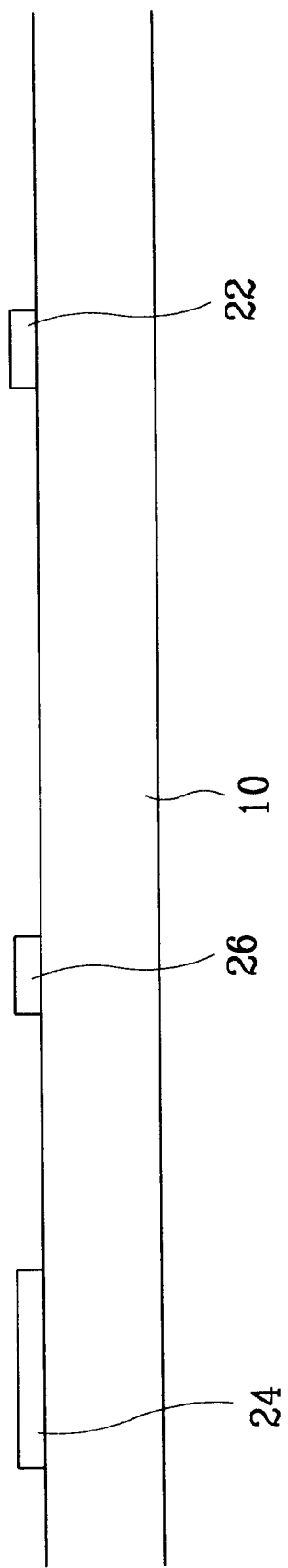
FIG. 8B is a sectional view taken along line VIIIb–VIIIb' of FIG. 8A.

With reference first to FIGS. 8A and 8B, a layer of a low-resistance aluminum group metal is formed on the substrate 10 to a thickness of approximately 2,500 Å. This layer is then patterned to form the gate wiring, which includes the gate lines 22, gate electrodes 26 and the gate pads 24. For the third embodiment, the pad auxiliary layer 25 is formed together with the gate wiring to realize the data pad portions.

Figure 9A:
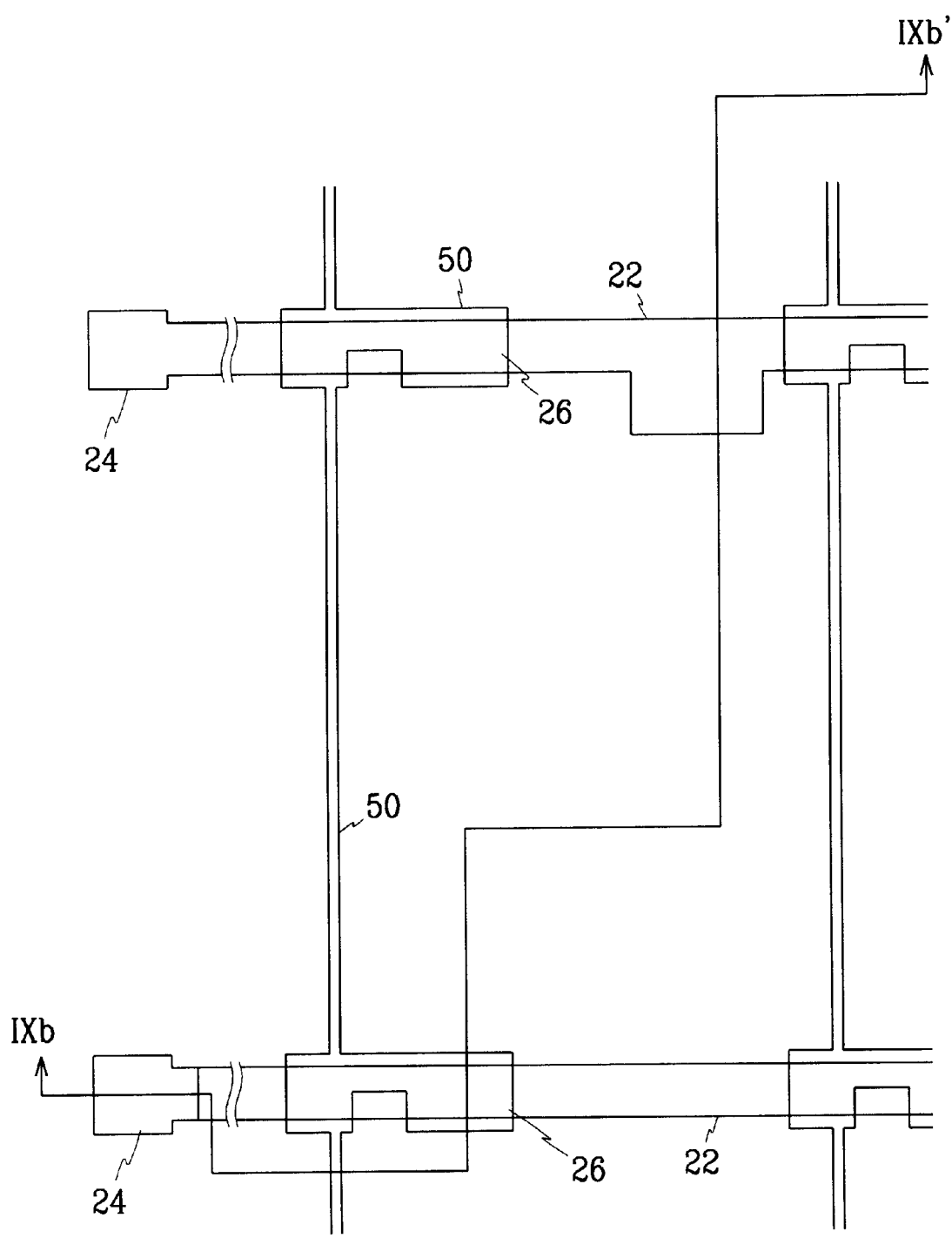

Next, with reference to FIGS. 9A and 9B, three layers are formed on the substrate 10 over the gate wiring. The three layers include a $SiN_x$ layer, an amorphous silicon layer, and a doped amorphous silicon layer. A mask is then used to pattern the layers into the gate insulation layer 30, the semiconductor layer 40 and a doped amorphous silicon layer 50. The pad auxiliary layer 45, which includes the amorphous silicon layers 44 and 54, is also formed in this process.

It is preferable that the gate insulation layer 30 is deposited over an interval of 5 minutes or more at a temperature of at least 300° C. When forming the gate insulation layer 30, the gate insulation layer 30 is provided over the gate wiring, then a portion or all of an $AlO_x$ layer having a high resistance may be removed and a low-resistance reaction layer, which is extracted from the aluminum group metal layer, may be formed. Further, before depositing the gate insulation layer 30, in order to prevent the formation of an $AlO_x$ layer on the aluminum group metal layer (i.e., the elements 22, 24 and 26 of the gate wiring), it is preferable that a rinsing process using plasma containing oxygen, helium or argon be performed in situ.

Figure 10A:
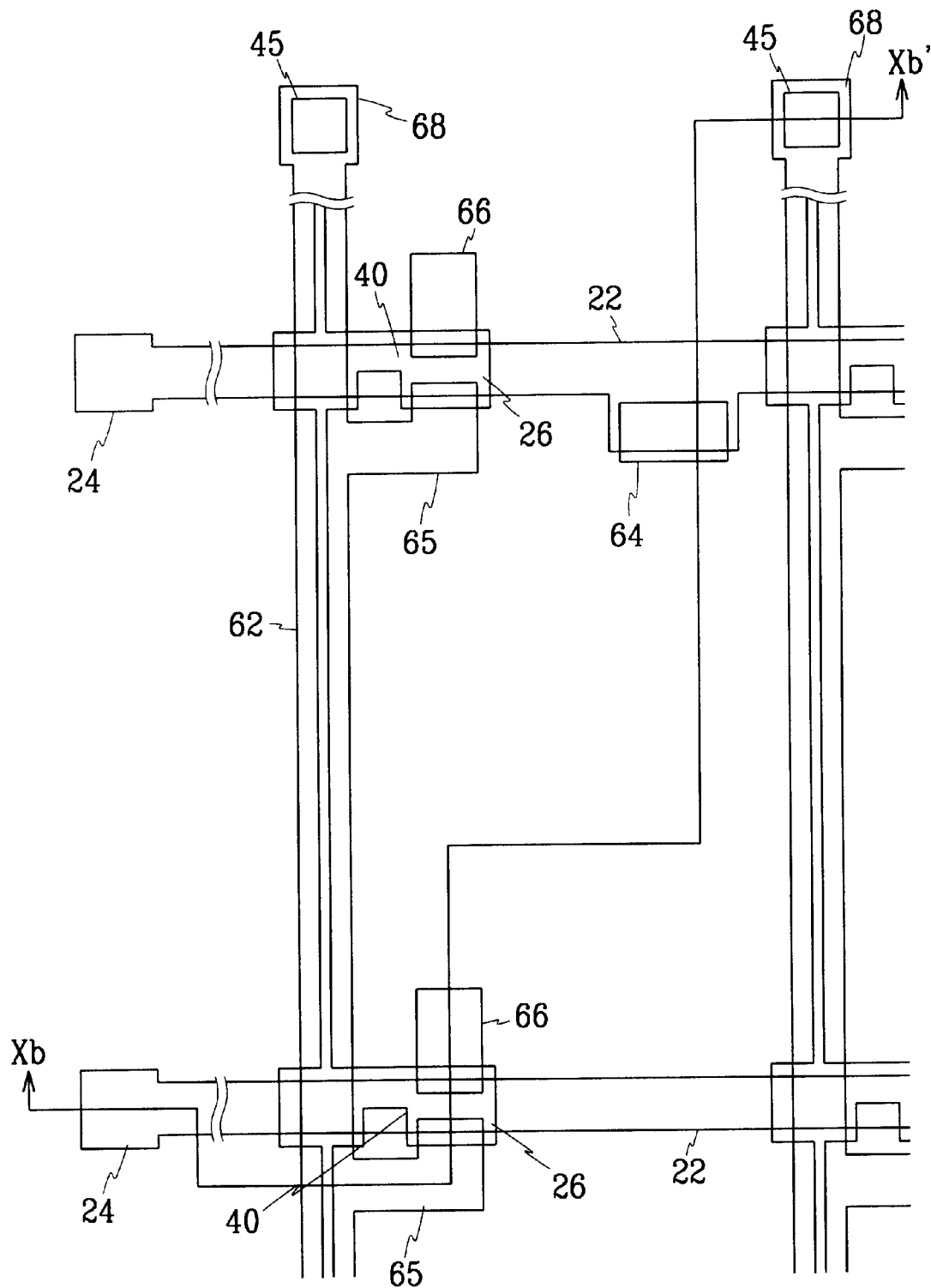
Figure 10B:
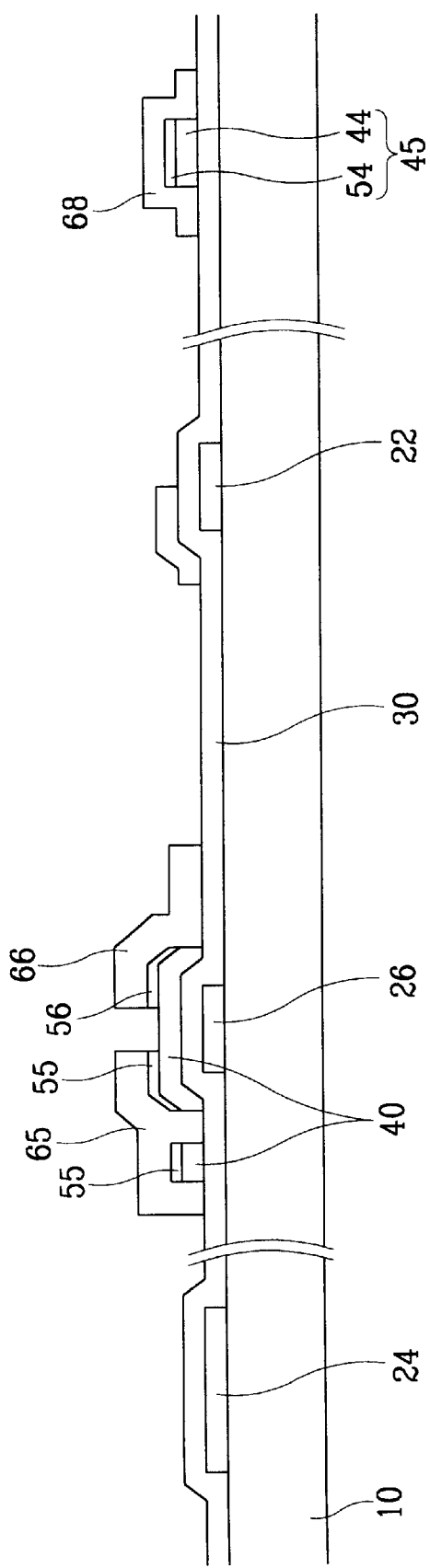
FIG. 10B is a sectional view taken along line Xb–Xb' of FIG. 10A, and shows a step following that depicted in FIG. 9B.

Following the above processes, with reference to FIGS. 10A and 10B, a metal layer made of chrome, molybdenum, a molybdenum alloy, titanium, tantalum, etc. is formed, then a photolithography process using a mask is performed to form the data wiring. In particular, formed in this process are the data lines 62 that cross the gate lines 22, the source electrodes 65 connected to the data lines 62 and extending over the gate electrodes 26, the data pads 68 connected to one end of the data lines 62 and covering the pad auxiliary layer 45, and drain electrodes 66 separated from the source electrodes 65 and located opposite around the gate electrodes 26. To realize the structure of the third preferred embodiment, the data pads 68 are formed having contact holes 69 over the pad auxiliary layer 25 (see FIGS. 6 and 7).

Subsequently, the doped amorphous silicon layer 50 not covering the elements 62, 65, 66 and 68 of the data wiring is etched to be divided into two portions about the gate electrodes and to expose the semiconductor pattern 40 between the amorphous silicon layer 40. It is preferable to then perform an oxygen plasma process to stabilize a surface of the amorphous silicon layer 40.

Figure 11A:
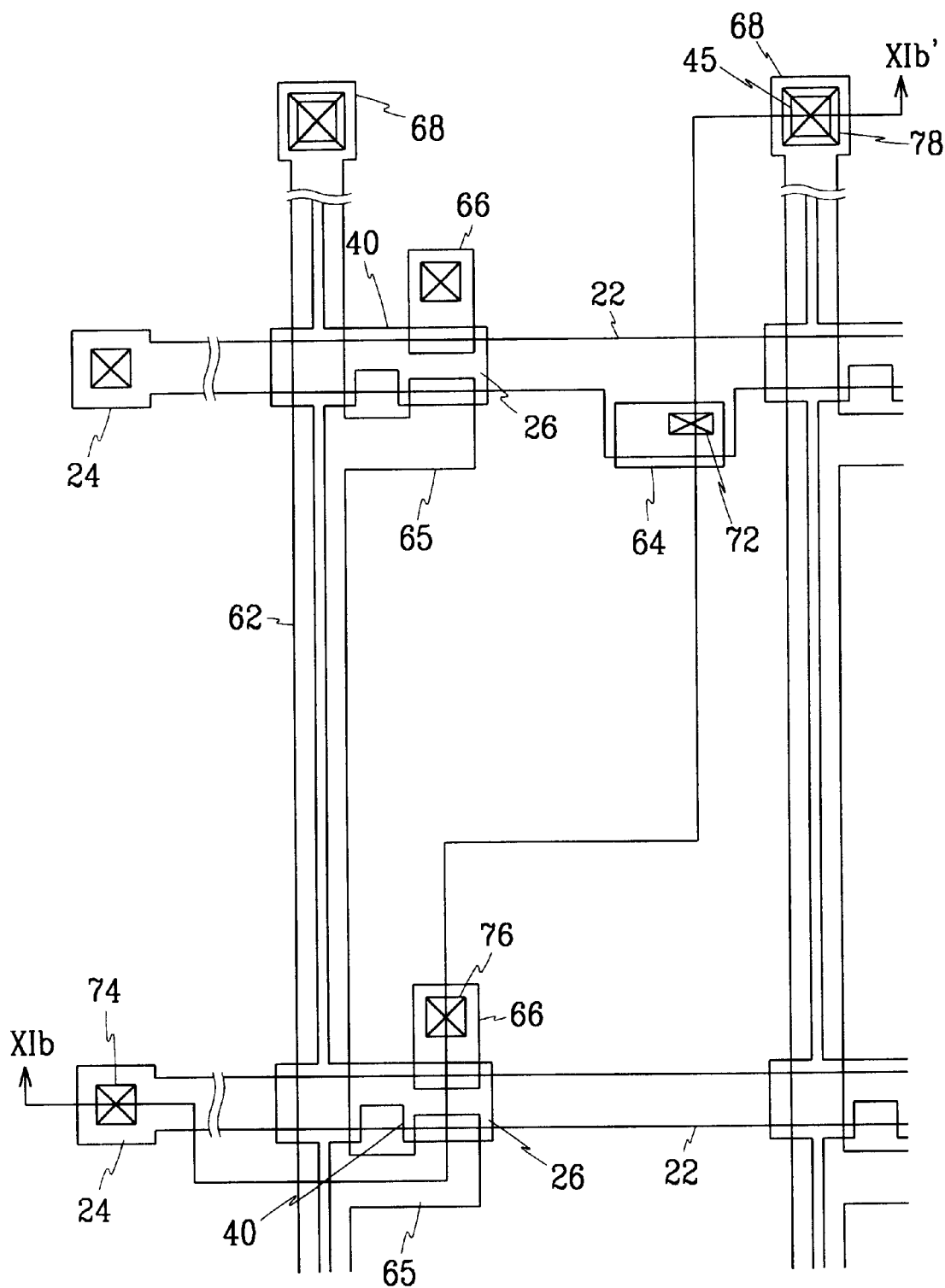
Figure 11B:
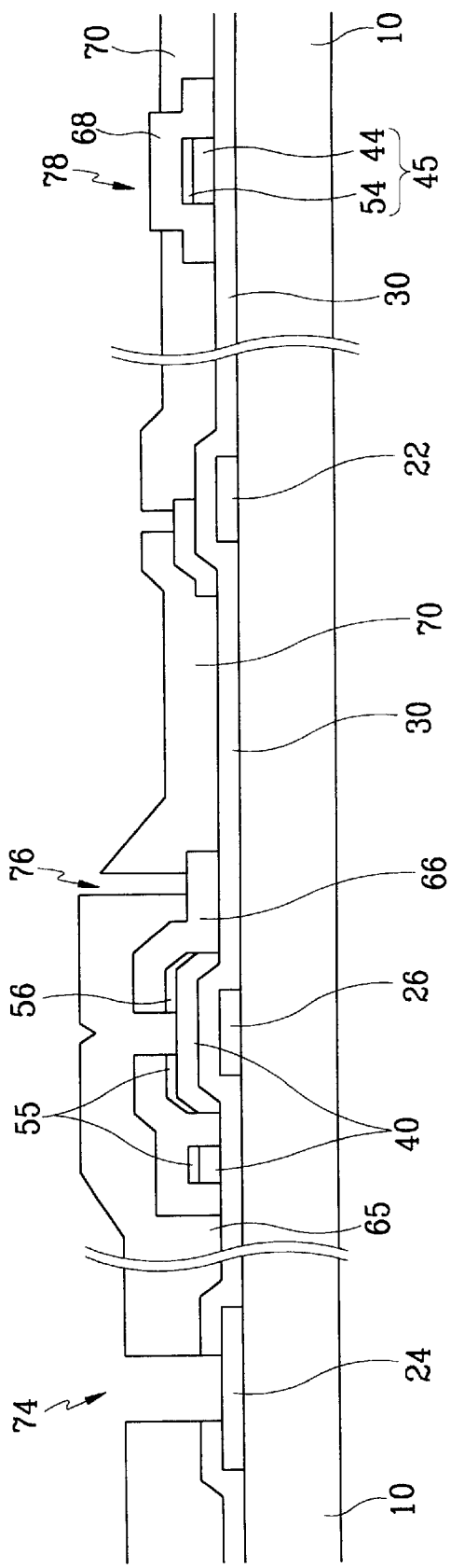
FIG. 11B is a sectional view taken along line XIb–XIb' of FIG. 11A, and shows a step following that depicted in FIG. 10B.

After the above processes, with reference to FIGS. 11A and 11B, an inorganic insulation layer is deposited to form the protection layer 70. At this time, as with the gate insulation layer 30, it is preferable that the protection layer 70 is deposited over an interval of 5 minutes or more at a temperature of at least 300° C. Also, a low-resistance reaction layer may be formed on the surface of the aluminum group metal layer (i.e., 22, 24 and 26), and a high-resistance metal oxide layer formed during manufacture may be partly or completely removed. Of course, the same effects can be obtained also in the case where the elements 62, 65, 66 and 68 of the data wiring contain aluminum group metals.

Next, patterning is performed through a photolithography process using a mask to thereby form the contact holes 74, 76 and 78 for exposing the gate pads 24, the drain electrodes 66 and the data pads 68, respectively. The contact holes 74, 76 and 78 can be formed in a cylindrical or rectangular shape. Also, the contact holes 74 and 78 exposing the pads 24 and 68, respectively, preferably do not exceed an area of 2 mm×60 μm and are greater than an area of 0.5 mm×15 μm.

To realize the structure of the second preferred embodiment, the protection layer 70 and the gate insulation layer 30 are removed from the data pad portions. For the third preferred embodiment, the gate insulation layer 30 exposed through the contact holes 69 of the data pads 68 is removed when forming the contact holes 78 of the protection layer 70, and the pad auxiliary layer 25 is exposed through the contact holes 69 of the data pads 68.

Lastly, with reference to FIGS. 2–8, an IZO layer is deposited, and patterned using a mask to form the pixel electrodes 82, which are connected to the drain electrodes 66 through the contact holes 76, and to form the auxiliary gate pads 86 and the auxiliary data pads 88, which are respectively connected to the gate pads 24 through the contact holes 74 and to the data pads 68 through the contact holes 78. It is possible to perform a pre-heating process before depositing the IZO layer, and it is preferable that nitrogen gas is used in order to prevent the formation of a metal oxide layer on the metal layer (i.e., the elements 22, 66 and 68) exposed by the contact holes 74, 76 and 78.

In the preferred embodiments of the present invention, in order to minimize the contact resistance of the contact portions, it is preferable that the IZO is deposited in the range of between room temperature and 200° C. Also, to form the IZO thin film, IDIXO (indium x-metal oxide) of Idemitsu Company was used in the present invention, in which preferably there are $In_2O_3$ and ZnO containing 15–20 at % of Zn therein. Before depositing the IZO, to prevent the formation of $AlO_x$ on the aluminum group metal layer 22, 24, and 26 of the gate wiring, a rinsing process using plasma containing oxygen, helium or argon may be performed in situ, and a rinsing process using an aluminum etching solution may be performed for patterning the aluminum group metal layer. At this time, it is preferable that the aluminum etching solution contains nitric acid ($HNO_3$), hydrochloric acid ($HPO_4$), acetic acid ($CH_3COOH$) and deionized water, and the rinsing process using the etching solution is performed for 10 seconds or less, and more preferably in the range of 7–10 seconds.

In the manufacturing method of the present invention as described above, an annealing process is performed when depositing the insulation layers 30 and 70 and before depositing the IZO layer in order to improve the contact characteristics between the IZO and aluminum group metal. Accordingly, the contact resistance of the contact portions is minimized such that the reliability of the contact portions is ensured.

Also, as described above, the data pad portions are formed in a protruding shape, or auxiliary pads and a low-resistance auxiliary layer are additionally provided to minimize the contact resistance of the pad portions and such that the contact reliability of the pad portions is improved during inspection, which takes place in the manufacturing process.

In the manufacturing method as described above, five masks are used. However, it is also possible to use only four masks. This will be described in more detail with reference to the drawings.

Figure 12:
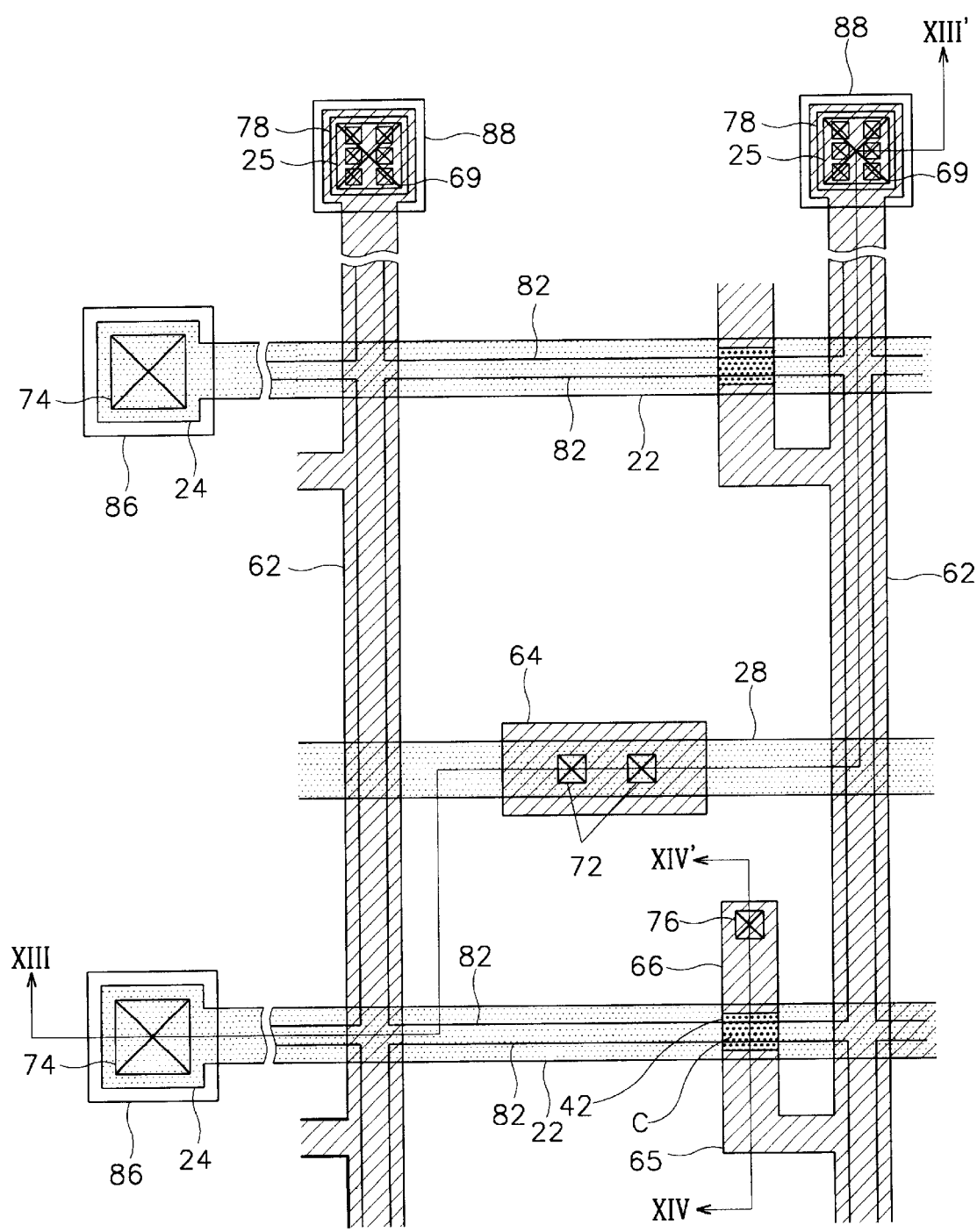
FIG. 12 is a schematic view of a thin film transistor substrate for a liquid crystal display according to a fourth preferred embodiment of the present invention.
Figure 13:
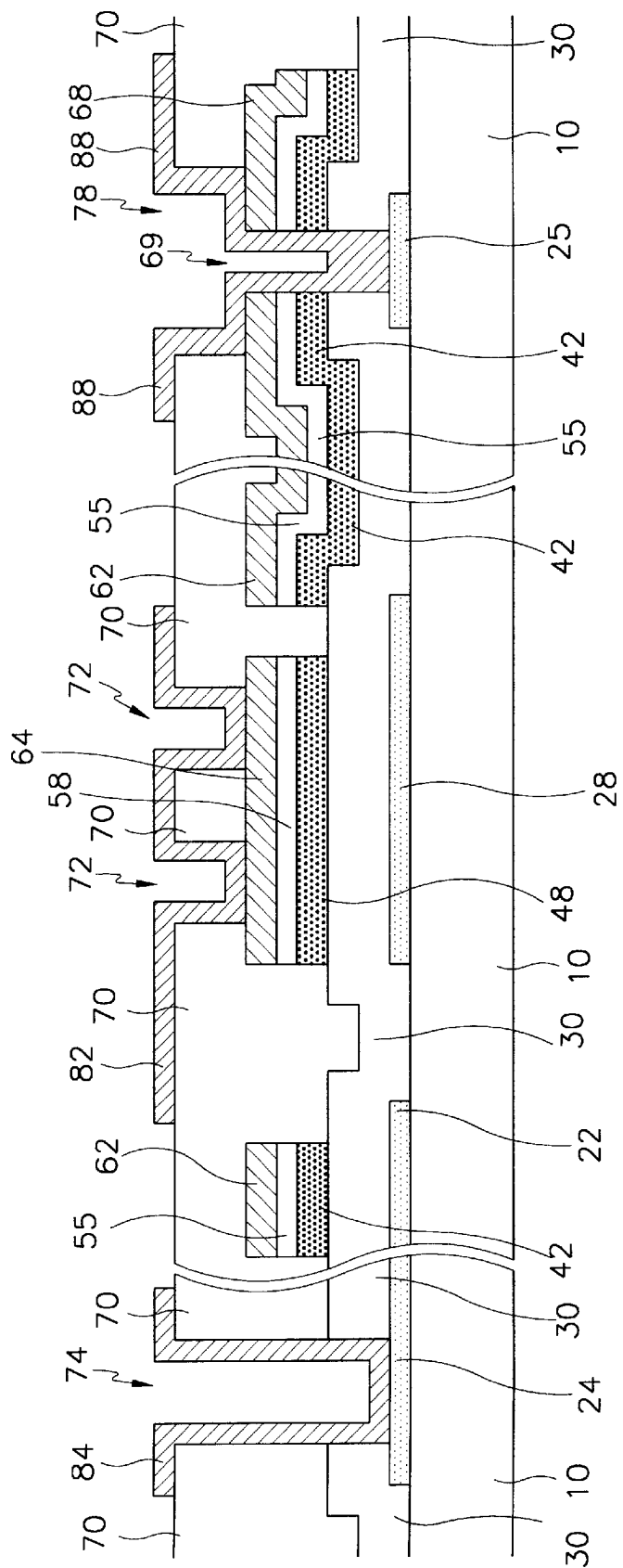
FIGS. 13 and 14 are sectional views taken along lines XIII–XIII' and XIV–XIV', respectively, of FIG. 12.
Figure 14:
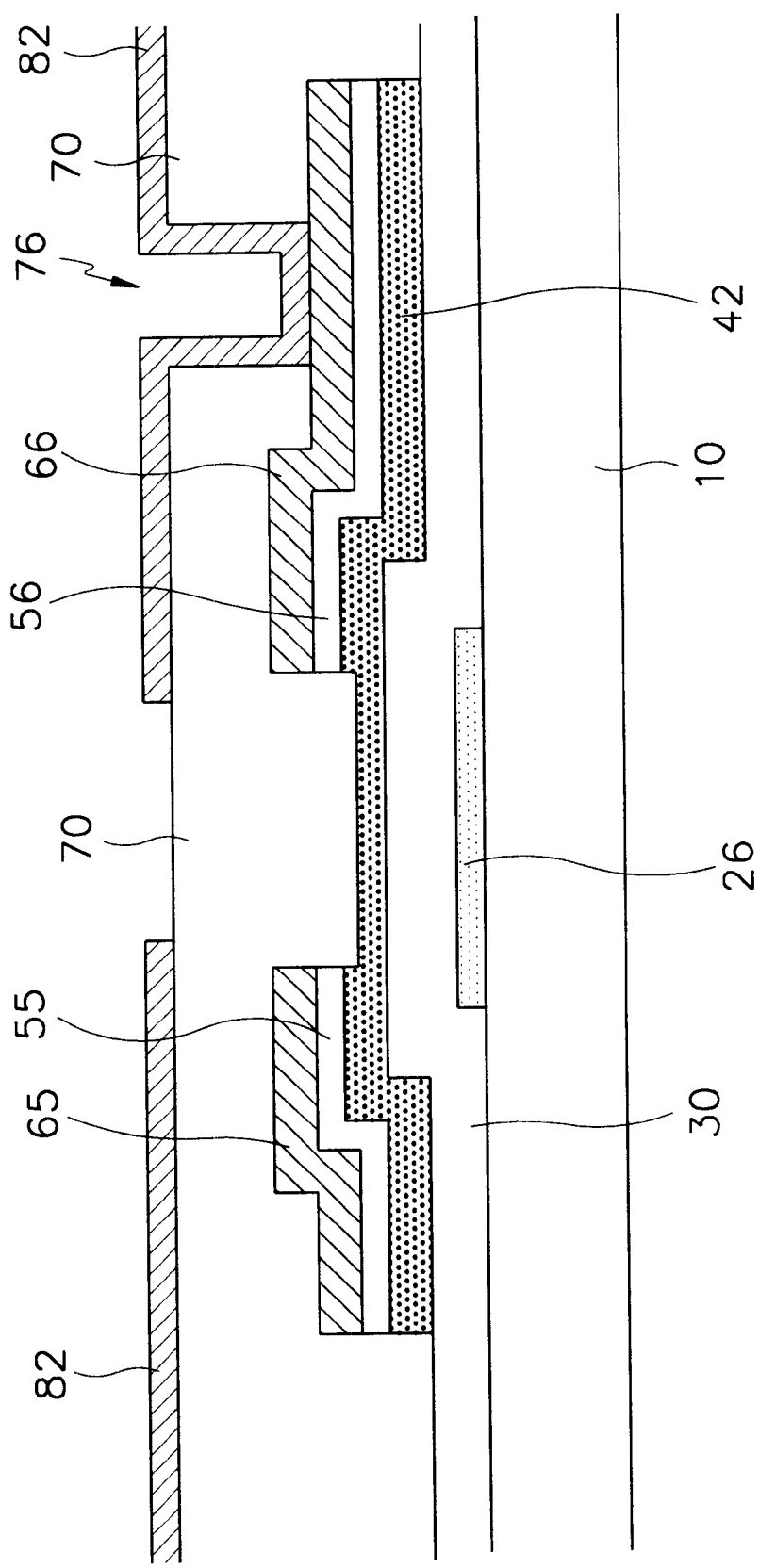

FIG. 12 shows a schematic view of a thin film transistor substrate for a liquid crystal display according to a fourth preferred embodiment of the present invention, and FIGS. 13 and 14 show sectional views taken along lines XIII–XIII' and XIV–XIV', respectively, of FIG. 12.

Gate wiring including gate lines 22, gate pads 24 and gate electrodes 26, which are made of an aluminum group metal, are formed on an insulation substrate 10. The gate wiring also includes storage electrodes 28 provided in parallel to the gate lines 22 on the substrate 10 and which receive voltages such as a common electrode voltage input to common electrodes. The storage electrodes 28 are overlapped by a conducting pattern 68, which is used as a storage capacitor and is connected to pixel electrodes 82 (to be described hereinafter), to thereby form a storage capacitor for improving a potential maintenance capacity of the pixels. If a storage capacity generated by the overlapping of the pixel electrodes 82 and the gate lines 22 is sufficient, it is possible to omit the storage electrodes 28. Further, a pad auxiliary layer 25 is formed on the substrate 10 as in the third embodiment.

A gate insulation layer 30 made of, for example, $SiN_x$ is formed over the elements 22, 24, 26 and 28 of the gate wiring and the pad auxiliary layer 25. Formed over the gate insulation layer 30 are semiconductor patterns 42 and 48, which are made of a semiconductor such as hydrogenated amorphous silicon. Ohmic contact layer patterns (or intermediate patterns) 55, 56 and 58 are formed over the semiconductor patterns 42 and 48. The ohmic contact layer patterns 55, 56 and 58 are made of amorphous silicon that is doped at a high concentration with n-type impurities such as phosphorus (P).

Data wiring is formed over the ohmic contact layer patterns 55, 56 and 58. The data wiring is made of metal such as chrome, molybdenum, a molybdenum alloy, tantalum, or titanium. The data wiring includes (a) a data line portion having data lines 62 formed vertically (in FIG. 12), data pads 68 connected to one end of the data lines 62 and receiving image signals, and source electrodes 65 of a thin film transistor which are branched from the data lines 62; (b) drain electrodes 66 of a thin film transistor separated from the elements 62, 68 and 65 of the data line portion, and positioned opposite the source electrodes 65 with respect to the gate electrodes 26 or a thin film transistor channel C; and (c) a storage capacitor conducting pattern 64 positioned over the storage electrodes 28. In the case where the storage electrodes 28 are not formed, the storage capacitor conducting pattern 64 is not required. The data pads 68 and the layers 42 and 55 under the data pads 68 are aligned, and include a contact hole 69 exposing the pad auxiliary layer 25.

The elements 62, 64, 65, 66 and 68 of the data wiring can be realized through a double layer structure that includes two conducting layers: a conducting layer made of molybdenum, a molybdenum alloy, tantalum, or titanium; and a conducting layer made of an aluminum group metal.

The ohmic contact layer patterns 55, 56 and 58 reduce the contact resistance of the semiconductor patterns 42 and 48, which are formed under the ohmic contact layer patterns 55, 56 and 58. They also reduce the contact resistance of the elements 62, 64, 65, 66 and 68 of the data wiring, which are formed over the ohmic contact layer patterns 55, 56 and 58. The ohmic contact layer patterns 55, 56 and 58 are formed in a shape identical to the elements 62, 64, 65, 66 and 68 of the data wiring. In particular, the ohmic contact layer pattern 55 is formed identically to the elements 62, 65 and 68, the ohmic contact layer pattern 56 is formed identically to the drain electrodes 66, and the ohmic contact layer pattern 58 is formed identically to the storage capacitor conducting pattern 64.

The semiconductor patterns 42 and 48, if the channel C is ignored, are formed in substantially the same shape as the elements 62, 64, 65, 66 and 68 of the data wiring and the ohmic contact layer patterns 55, 56 and 58. In particular, the storage capacitor semiconductor pattern 48, the storage capacitor conducting pattern 64 and the ohmic contact layer pattern 58 are formed in the same shape. However, the thin film transistor semiconductor pattern 42 is formed slightly different from the data wiring and the ohmic contact layer patterns 55 and 56. That is, while the source electrodes 65, the drain electrodes 66, and the ohmic contact layer patterns 55 and 56 are separated at the channel C, the semiconductor pattern 42 is not separated at this area and continues through the channel C.

A protection layer 70 is formed over the elements 62, 64, 65, 66 and 68 of the data wiring. The protection layer 70 is made of $SiNi_x$. The protection layer 70 includes contact holes 76, 78 and 72 for exposing the drain electrodes 66, the storage capacitance conducting pattern 64 and the data pads 68, respectively. The protection layer 70 also includes a contact hole 74 for exposing the gate insulation layer 30. It is preferable that the contact hole 78 of the protection layer 70 is larger than the pad auxiliary layer 25.

The pixel electrodes 82 are formed over the protection layer 70, and receive image signals from the thin film transistor and generate an electric field together with an electrode formed on an upper substrate. The pixel electrodes 82 are made of a transparent conducting material such as IZO, and are physically and electrically connected to the drain electrodes 66 through the contact hole 76 to receive the image signals. Further, the pixel electrodes 82 overlap the gate lines 22 and the data lines 62 to increase an aperture ratio. However, there may be no overlapping of these elements. The pixel electrodes 82 are also connected to the storage capacitance conducting pattern 64 through the contact hole 72 to receive image signals from the storage capacitance conducting pattern 64.

The auxiliary gate pads 86 and the auxiliary data pads 88 are formed respectively over the gate pads 24 and the data pads 68 to make contact with the same through the contact holes 74 and 78. As a result, contact between the pads 24 and 68 and an external circuit unit is ensured, and the pads 24 and 68 are protected. However, such a structure is optional. The auxiliary data pads 88 are physically and electrically connected to the pad auxiliary layer 25 via the contact hole 69 of the data pads 68.

A method for manufacturing the TFT substrate for liquid crystal displays of FIGS. 12, 13 and 14 using four masks will now be described.

Figure 15A:
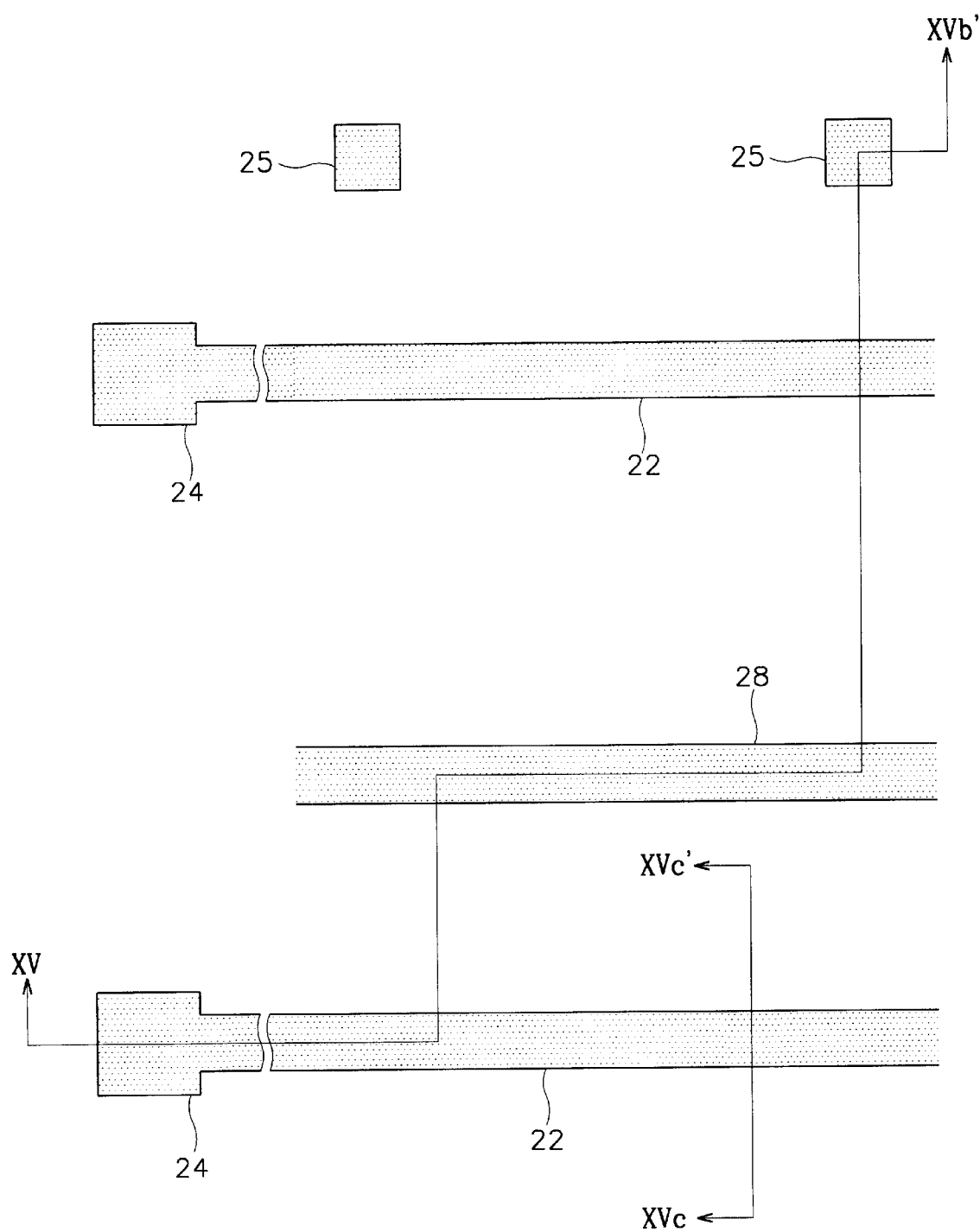
FIG. 15A is a schematic view of a first step in the manufacture of a thin film transistor substrate according to a fourth preferred embodiment of the present invention.
Figure 15B:
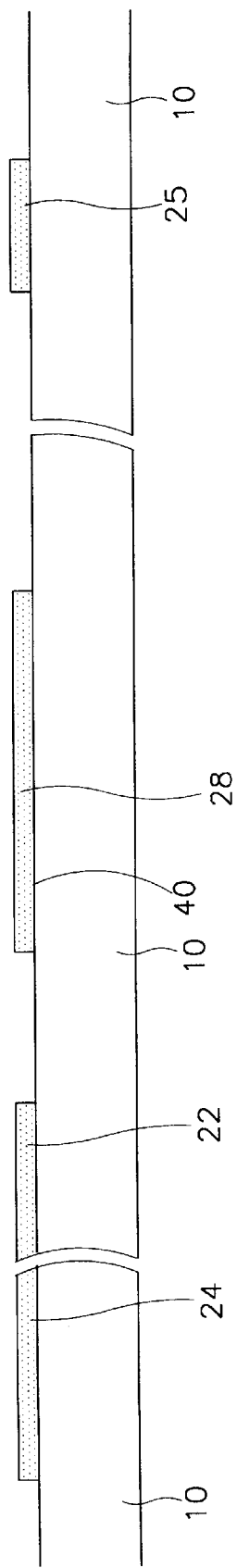
FIGS. 15B and 15C are sectional views taken along lines XVb–XVb' and XVc–XVc', respectively, of FIG. 15A.
Figure 15C:
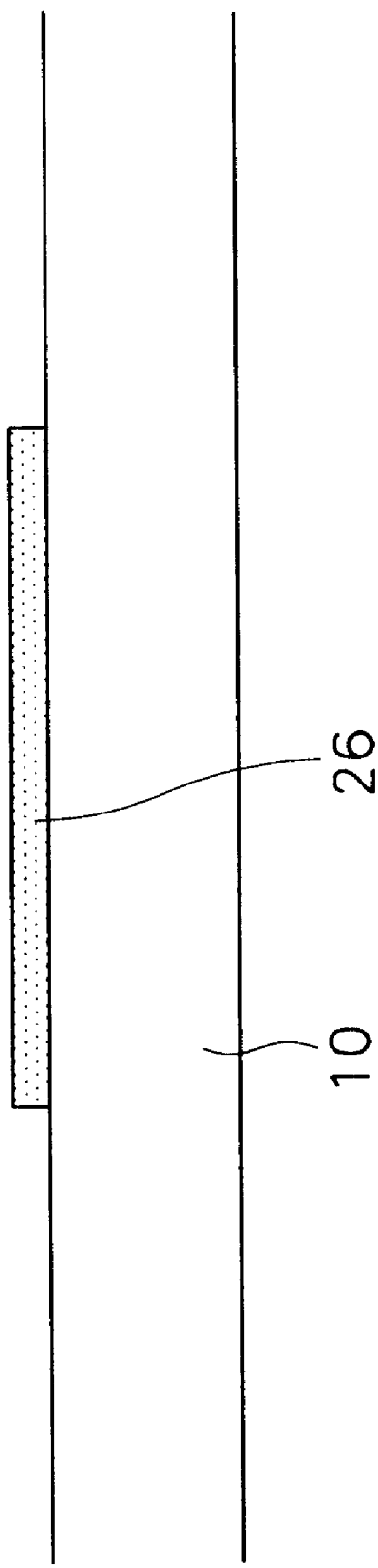

With reference first to FIGS. 15A, 15B and 15C, an aluminum group metal layer is deposited on the substrate, then a photolithography process using a mask is performed to form the gate wiring, which includes the gate lines 22, the gate pads 24, the gate electrodes 26, and the storage electrodes 28, and to form the pad auxiliary layer 25.

Figure 16A:
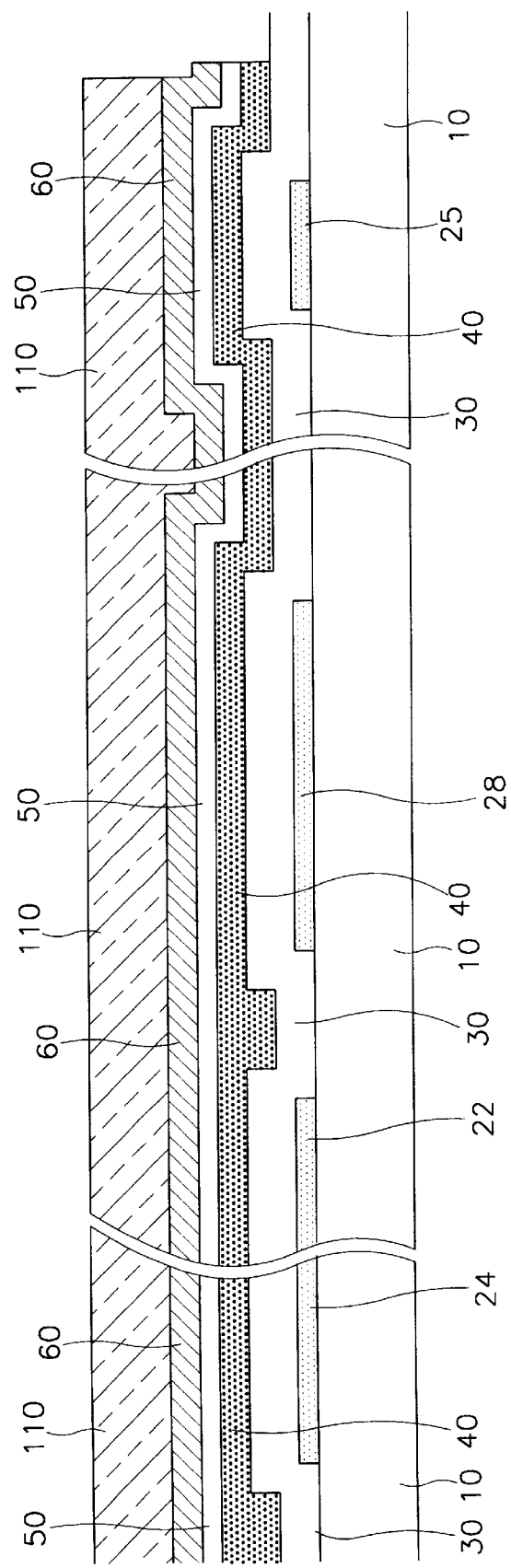
FIGS. 16A and 16B are sectional views taken along lines XVb–XVb' and XVc–XVc', respectively, of FIG. 15A, and they show steps following those depicted in FIGS. 15B and 15C, respectively.
Figure 16B:
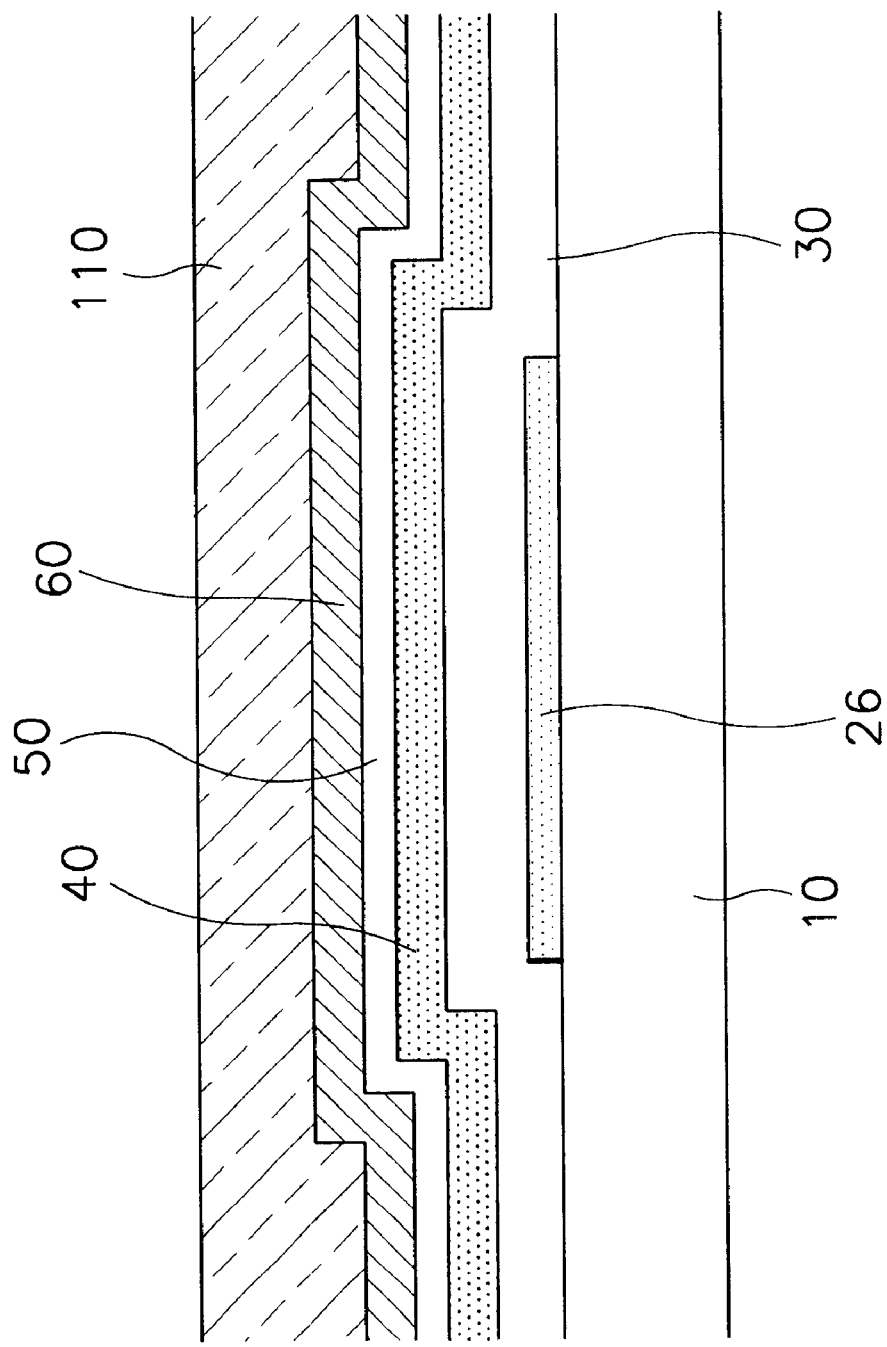

Next, with reference to FIGS. 16A and 16B, the gate insulation layer 30, the semiconductor layer 40 and the doped amorphous silicon layer 50, which are made of $SiNi_x$, are deposited using a chemical vapor deposition method respectively at thicknesses of 1,500 to 5,000 Å, 500 to 2,000 Å, and 300 to 600 Å. Subsequently, a conducting layer 60, which includes a metal layer of chrome, is deposited at a thickness of 1,500 to 3,000 Å using a sputtering process, for example, after which a photosensitive layer 110 is deposited at a thickness of between 1 µm and 2 µm. It is preferable that the gate insulation layer 30 is deposited over an interval of 5 minutes or more at a temperature of at least 300° C. When forming the gate insulation layer 30, the gate insulation layer 30 is provided over the gate wiring, then a portion or all of an $AlO_x$ layer having a high resistance may be removed, and a low-resistance reaction layer, which is extracted from the aluminum group metal layer, may be formed. Further, before depositing the gate insulation layer 30, in order to prevent the formation of an $AlO_x$ layer on the aluminum group metal layer (i.e., the elements 22, 24 and 26 of the gate wiring), it is preferable that a rinsing process using plasma containing oxygen, helium or argon be performed in situ.

Figure 17A:
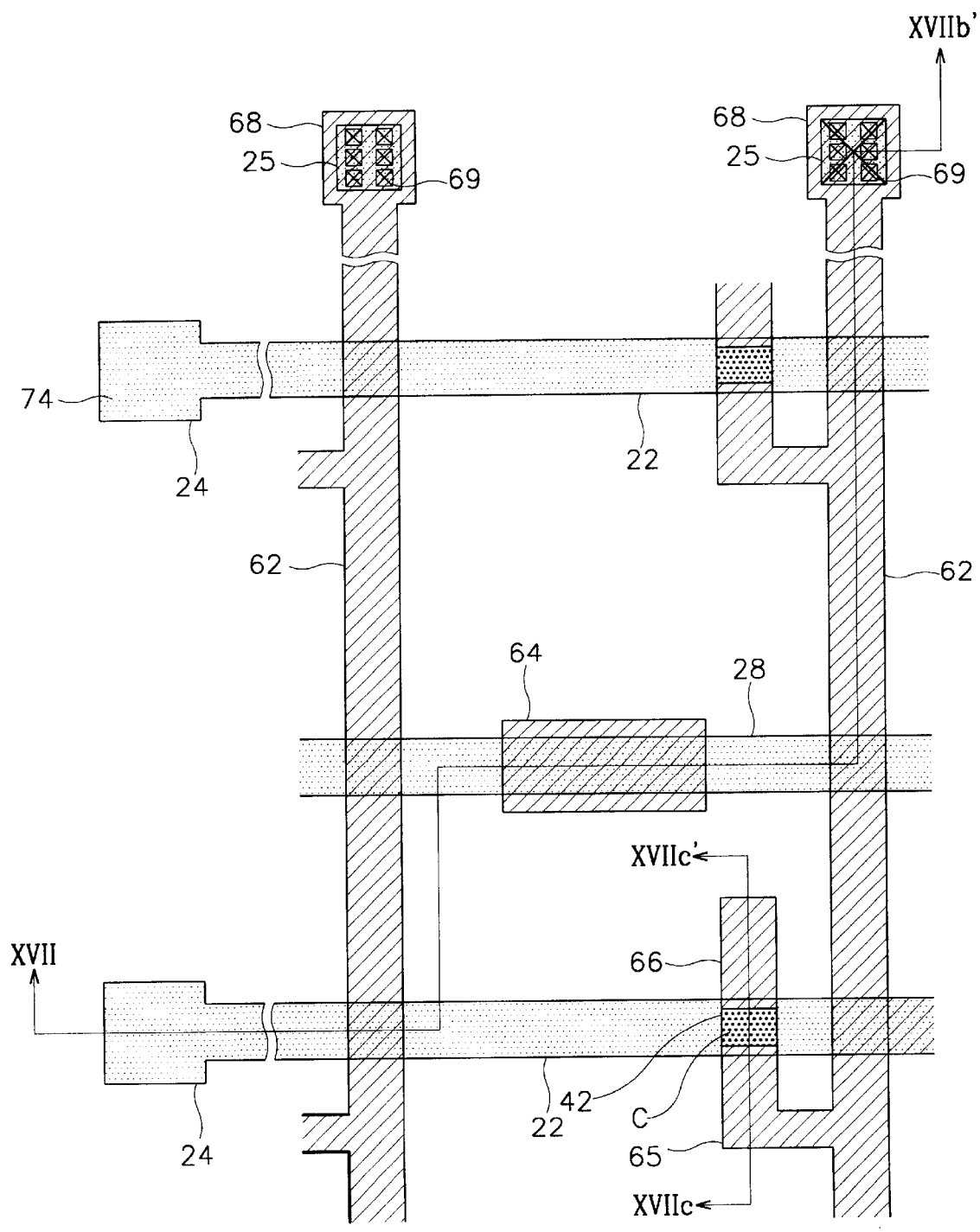
FIG. 17A is a schematic view of a thin film transistor substrate in a manufacturing step following that depicted in FIGS. 16A and 16B.
Figure 17B:
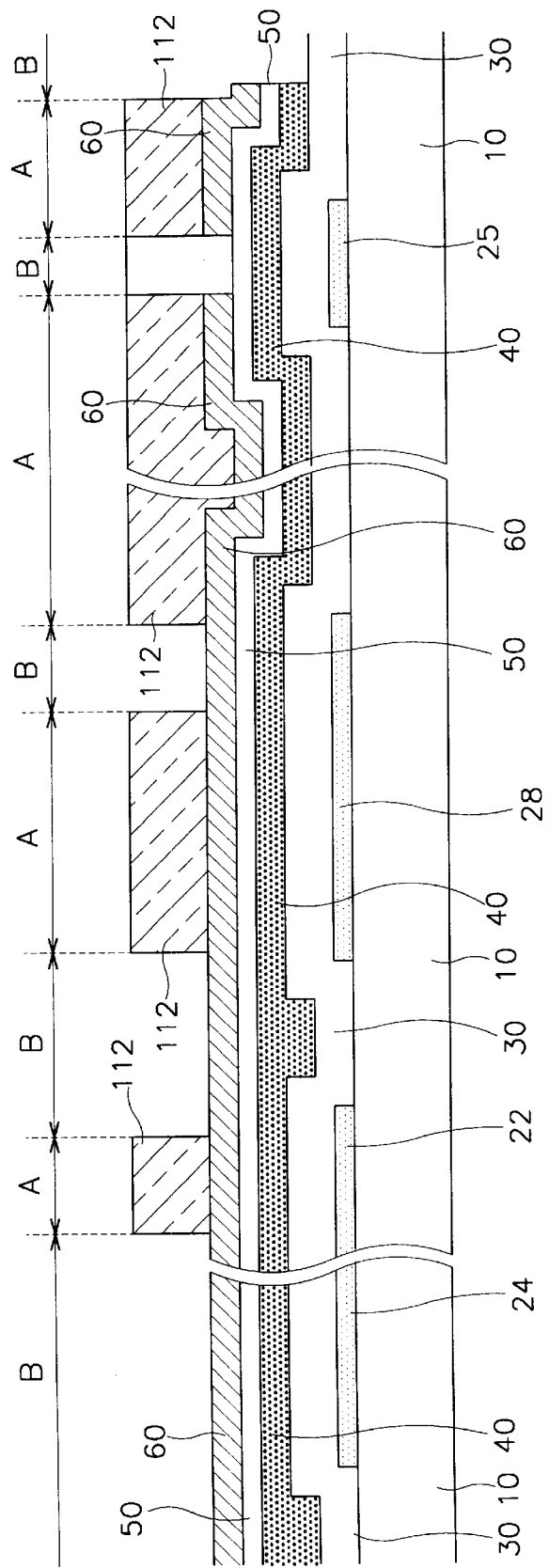
FIGS. 17B and 17C are sectional views taken along lines XVIIb–XVIIb' and XVIIc–XVIIc', respectively, of FIG. 17A.
Figure 17C:
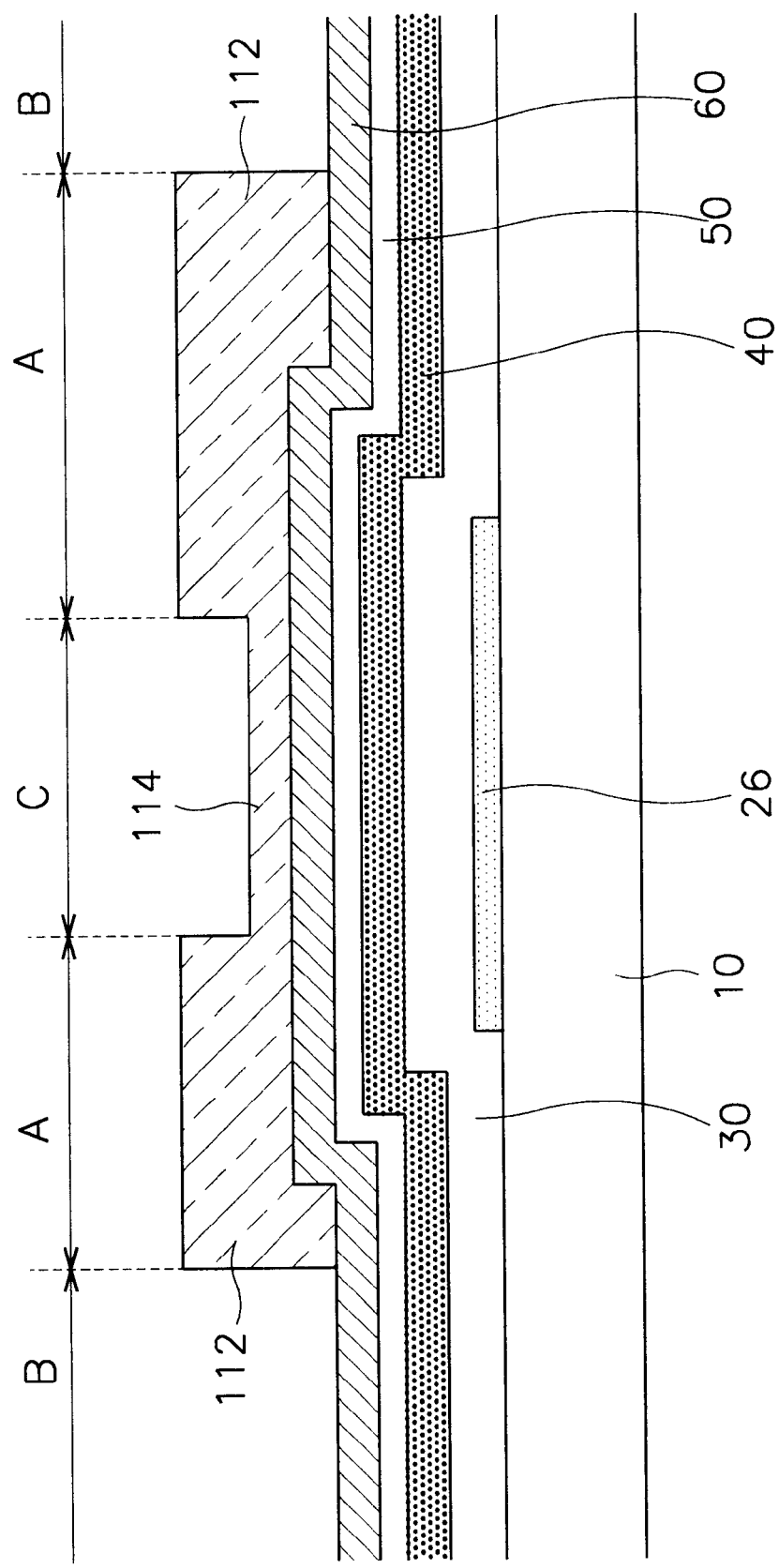

Then, light is irradiated on the photosensitive layer 110 using a mask to develop the photosensitive layer 110, and, with reference to FIGS. 17B and 17C, photosensitive layer patterns 112 and 114 are formed. Here, the channel C of the thin film transistor, that is, the photosensitive layer pattern 114 between the source electrodes 65 and the drain electrodes 66 is thinner than the photosensitive layer pattern 112, which is positioned at a data wiring portion A, or areas where the elements 62, 64, 65, 66 and 68 of the data wiring are formed. The photosensitive layer at remaining portions is removed. At this time, a ratio in the thicknesses of the photosensitive layer patterns 112 and 114 varies depending upon conditions of the etching process. Preferably, the ratio between the thickness of the photosensitive layer pattern 114 to the thickness of the photosensitive layer pattern 112 is 1:2 or less.

There are various methods that can be used to adjust the thickness of the photosensitive layer patterns 112 and 114. For example, slits or lattice shapes can be used to control the amount of irradiated light, or a semitransparent layer can be used. In the case where slits are used, it is preferable that a pattern line width between the slits or an interval between the patterns, that is, a width of the slits, is smaller than a resolution of an exposure device. If a semitransparent layer is used to control the transmissivity when manufacturing the mask, thin films of differing transmissivity or different thicknesses may be used.

With the irradiation of light on the photosensitive layer through a mask, portions directly exposed are fully dissolved, and areas where a slit pattern or a semitransparent layer is formed receive limited light such that the high polymers are not completely dissolved. Also, in areas where a light-blocking layer are formed, the high polymers undergo almost no dissolution. As the photosensitive layer is developed, only areas where the high polymers are not dissolved remain, and center areas where a limited amount of light is irradiated can be formed at a smaller thickness than where light is fully blocked. However, the exposing time must be controlled since all the polymers dissolve if an excessively exposed to light.

The thin photosensitive layer pattern 114 is made of a photosensitive layer that enables reflow, and is exposed using a mask with portions that fully allow the transmission of light and portions that fully block the transmission of light. Next, reflow is performed so that a portion of the photosensitive layer is flowed to areas where no photosensitive layer remains. Next, the photosensitive layer 114 and layers under the same, that is, the conducting layer 60, the doped amorphous silicon layer 50 and the semiconductor layer 40 are etched. At this time, data wiring and the layers under the data wiring are left as is at the data wiring portion A, and only the semiconductor layers are left in the channel C. At the remaining portions B, all three layers 40, 50 and 60 are completely removed, and the gate insulation layer 30 is exposed.

Figure 18A:
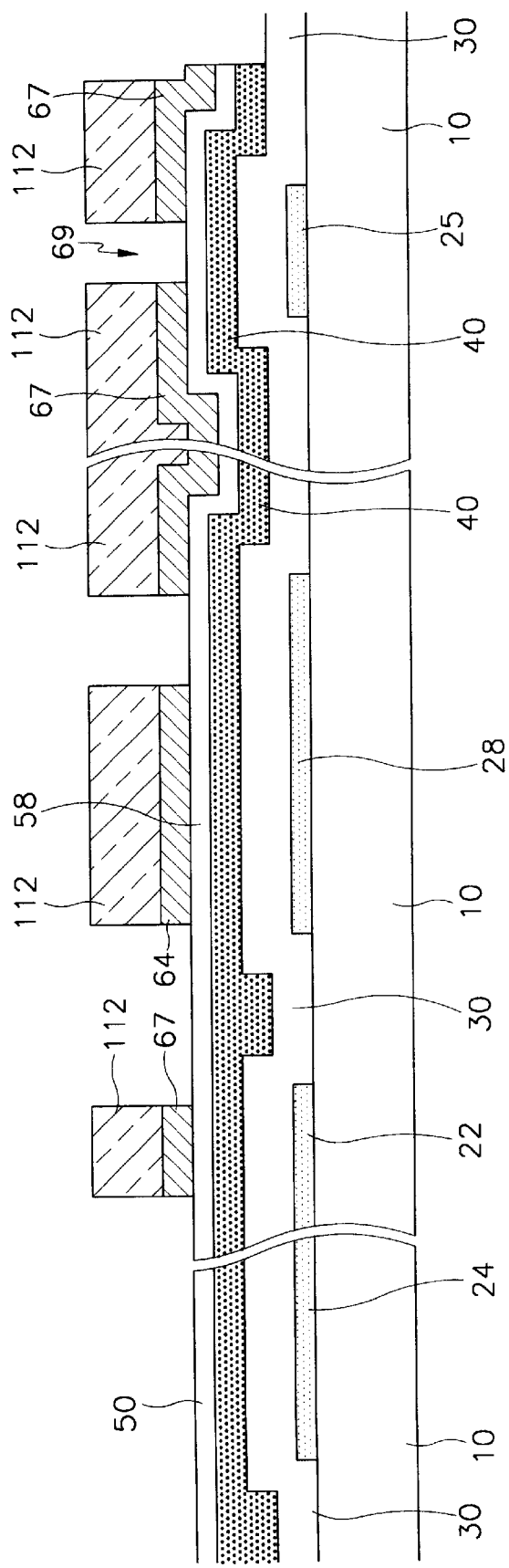
FIGS. 18A, 19A and 20A are sectional views taken along line XVIIb–XVIIb' of FIG. 17A for showing sequential steps in the manufacturing process following the step illustrated in FIG. 17B.
Figure 18B:
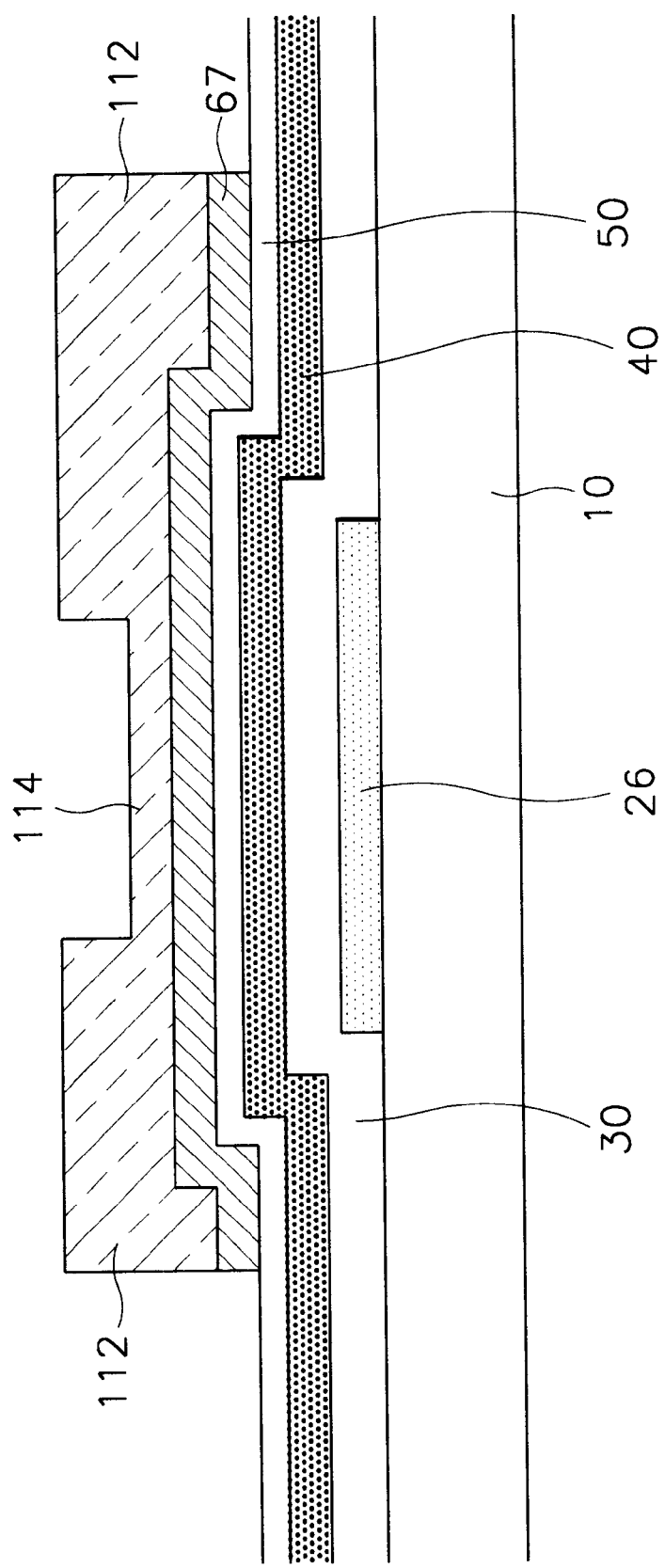
FIGS. 18B, 19B and 20B are sectional views taken along line XVIIc–XVIIc' of FIG. 17A for showing sequential steps in the manufacturing process following the step illustrated in FIG. 17C.

With reference to FIGS. 18A and 18B, the conductive layer 60 exposed at the portions B is removed such that the doped amorphous silicon layer 50 is exposed. The contact holes 69 are also formed at this time. In this process, either the dry etch or wet etch method may be used. Also, it is preferable that the conducting layer 60 is etched, while the photosensitive layer patterns 112 and 114 undergo almost no etching. However, when the dry etch method is used, since it is difficult to only etch the conducting layer 60 and not the photosensitive layer patterns, the photosensitive layer patterns 112 and 114 are also etched. In this case, the photosensitive layer pattern 114 is made thicker than in the wet etch method so that when the pattern 114 is removed, the conducting layer 60 underneath is not exposed.

If the conducting layer 60 is Mo, a MoW alloy, Al, an Al alloy, or Ta, either the dry etch or wet etch method may be used. However, if the conducting layer 60 is made of Cr, it is preferable that the wet etch method be used since removal of Cr is difficult using the dry etch method. If the conducting layer 60 is made of Cr and the wet etch method is used, $CeNHO_3$ may be used as the etching solution. If the conducting layer 60 is made of Mo or MoW and the dry etch method is used, a gas mixture of $CF_4$ and HCl or $CF_4$ and $O_2$ may be used, with the etching ratio of the photosensitive layer being almost identical in the latter case.

Accordingly, with reference to FIGS. 18A and 18B, the only areas left remaining are the channel C and the conducting layer of the data wiring portion B, that is, the source/drain conducting pattern 67 and the storage capacitor conducting pattern 64, whereas the conducting layer 60 of the remaining portion B is completely removed such that the doped amorphous silicon layer 50 is exposed. At this time, the remaining conducting patterns 67 and 64, except where the source and drain electrodes 65 and 66 are connected, are patterned identically to the elements 62, 64, 65, 66 and 68 of the data wiring. Further, when the dry etch method is used, the photosensitive layer patterns 112 and 114 are etched to a predetermined thickness.

Figure 19A:
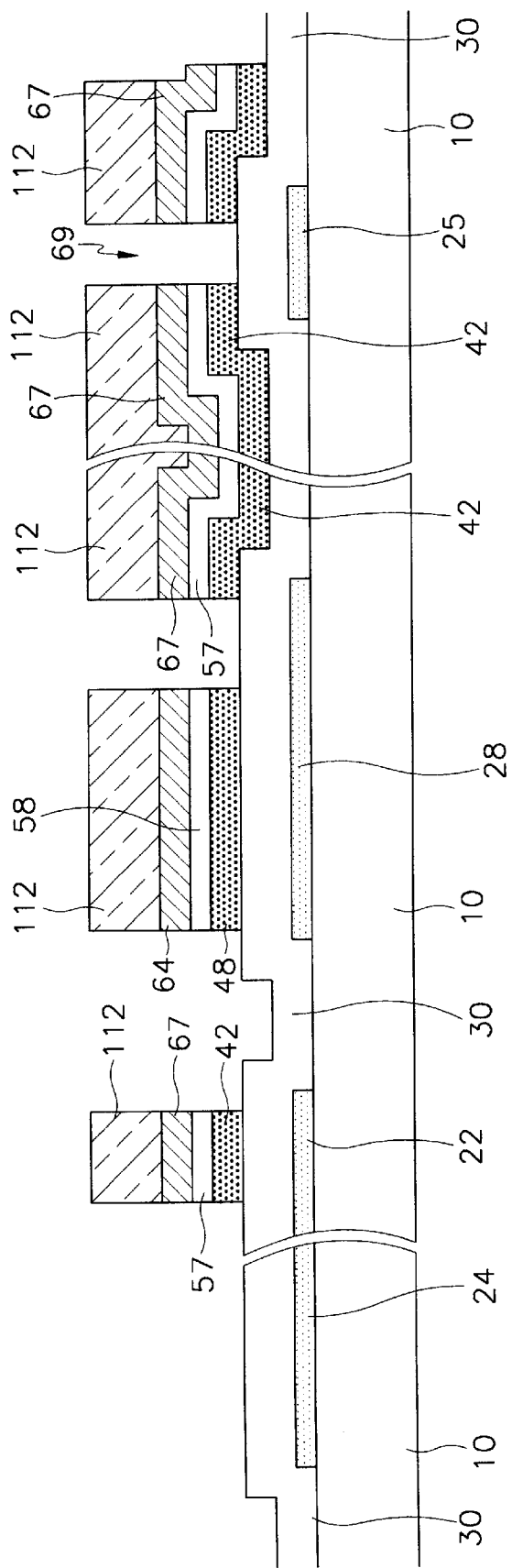
Figure 19B:
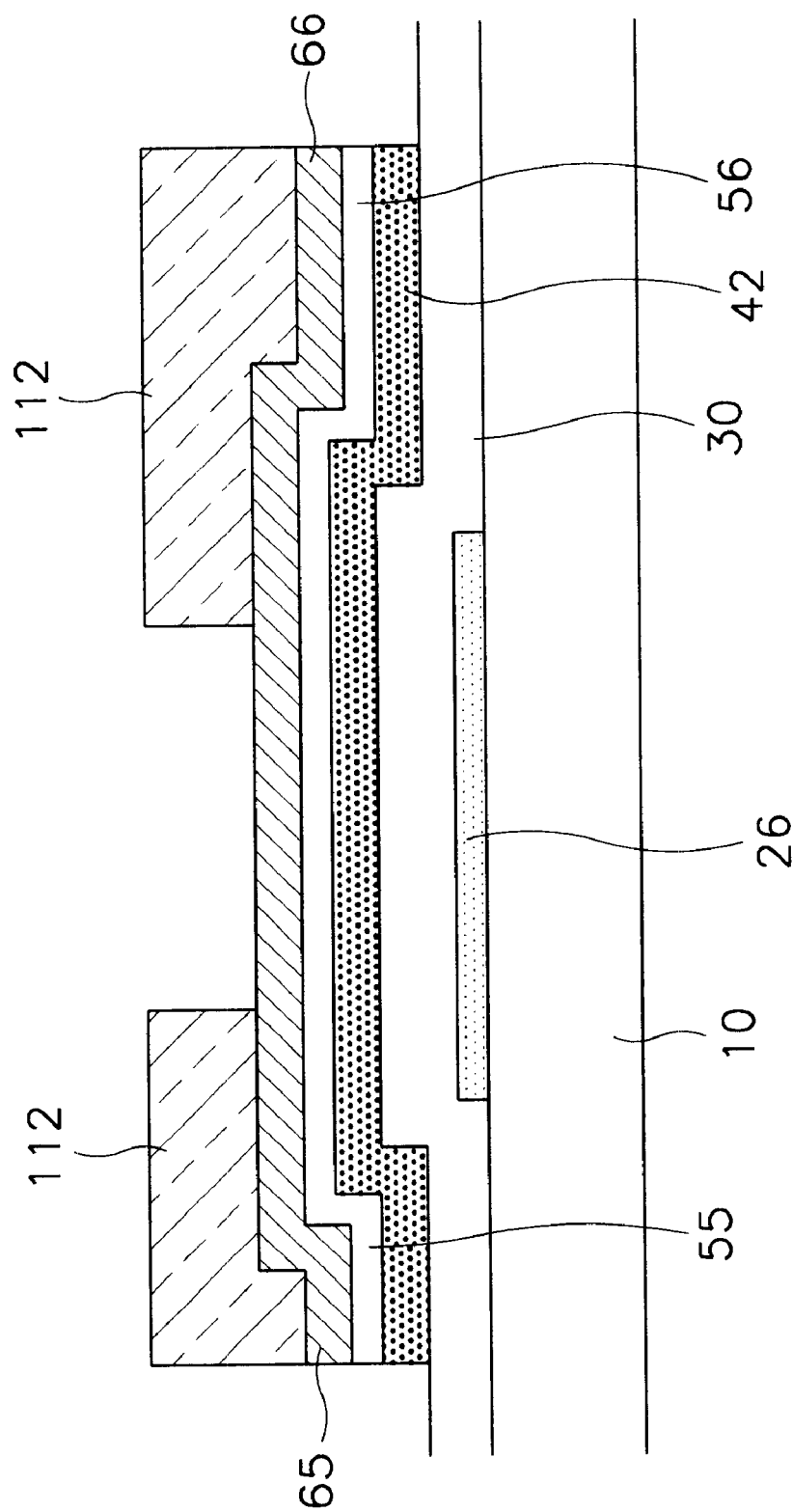

Next, with reference to FIGS. 19A and 19B, the remaining portions B and the doped amorphous silicon layer 50 and semiconductor layer 40 exposed through the contact hole 69 are removed together with the photosensitive layer pattern 114 using a dry etching process. At this time, etching must be performed such that the photosensitive layer patterns 112 and 114, the doped amorphous silicon layer 50 and the semiconductor layer 40 (the semiconductor layer 40 and the doped amorphous silicon layer 50 have almost no etch selectivity) are etched simultaneously, while the gate insulation layer 30 is not etched. In particular, it is preferable that etch ratios of the photosensitive layer patterns 112 and 114, and the semiconductor layer 40 are almost identical. Nearly identical thicknesses can be obtained if, for example, a mixture of $SF_6$ and HCl, or of $SF_6$ and $O_2$ is used. If the etch ratios of the photosensitive layer patterns 112 and 114, and the semiconductor layer 40 are identical, it is necessary that a thickness of the photosensitive layer pattern 114 is equal to or less than the added thicknesses of the semiconductor layer 40 and the doped amorphous silicon layer 50.

As a result of the above, the photosensitive layer pattern 114 of the channel C is removed such that the source/drain conducting pattern 67 is exposed, and the remaining portions B and the doped amorphous silicon layer 50 of the contact hole 60 and the semiconductor layer 40 are removed so that the gate insulation layer 30 is exposed. Since the photosensitive layer pattern 112 of the data wiring portion A is also etched, the thickness thereof is reduced. The semiconductor patterns 42 and 48 are completed in this step. Reference numerals 57 and 58 indicate an intermediate layer pattern of the source/drain conducting pattern 67 and an intermediate layer pattern of the storage capacitor conducting pattern 64. Photosensitive residue remaining on a surface of the source/drain conducting pattern 67 of the channel C is removed through an ashing process.

Figure 20A:
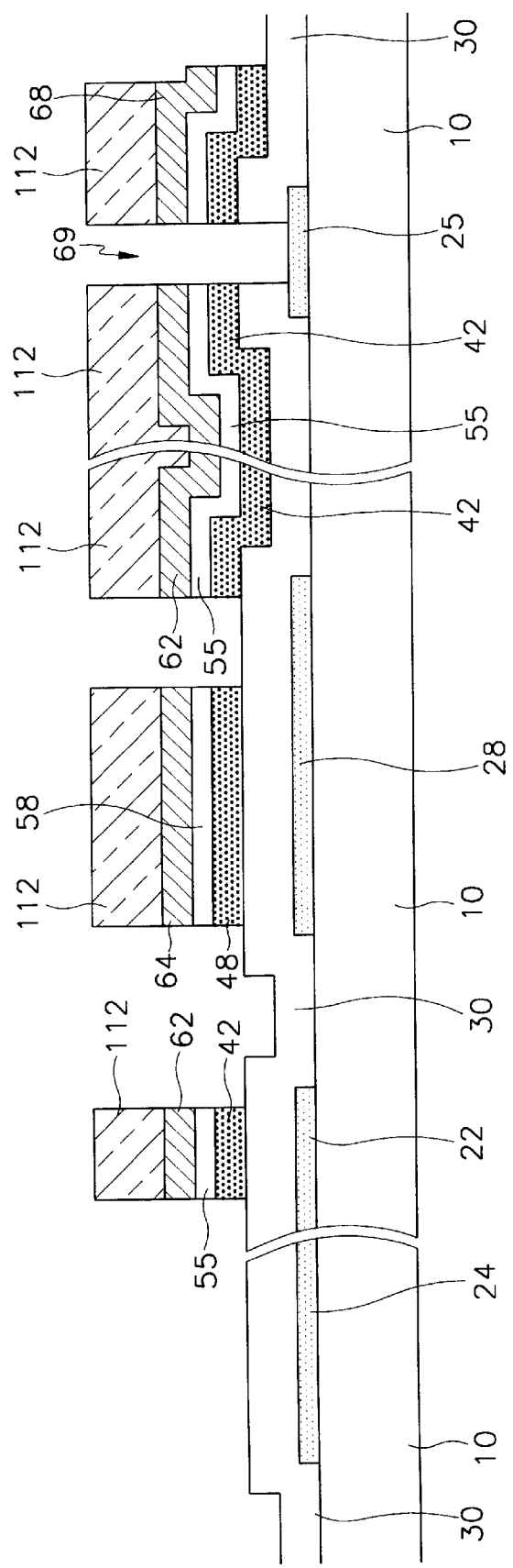
Figure 20B:
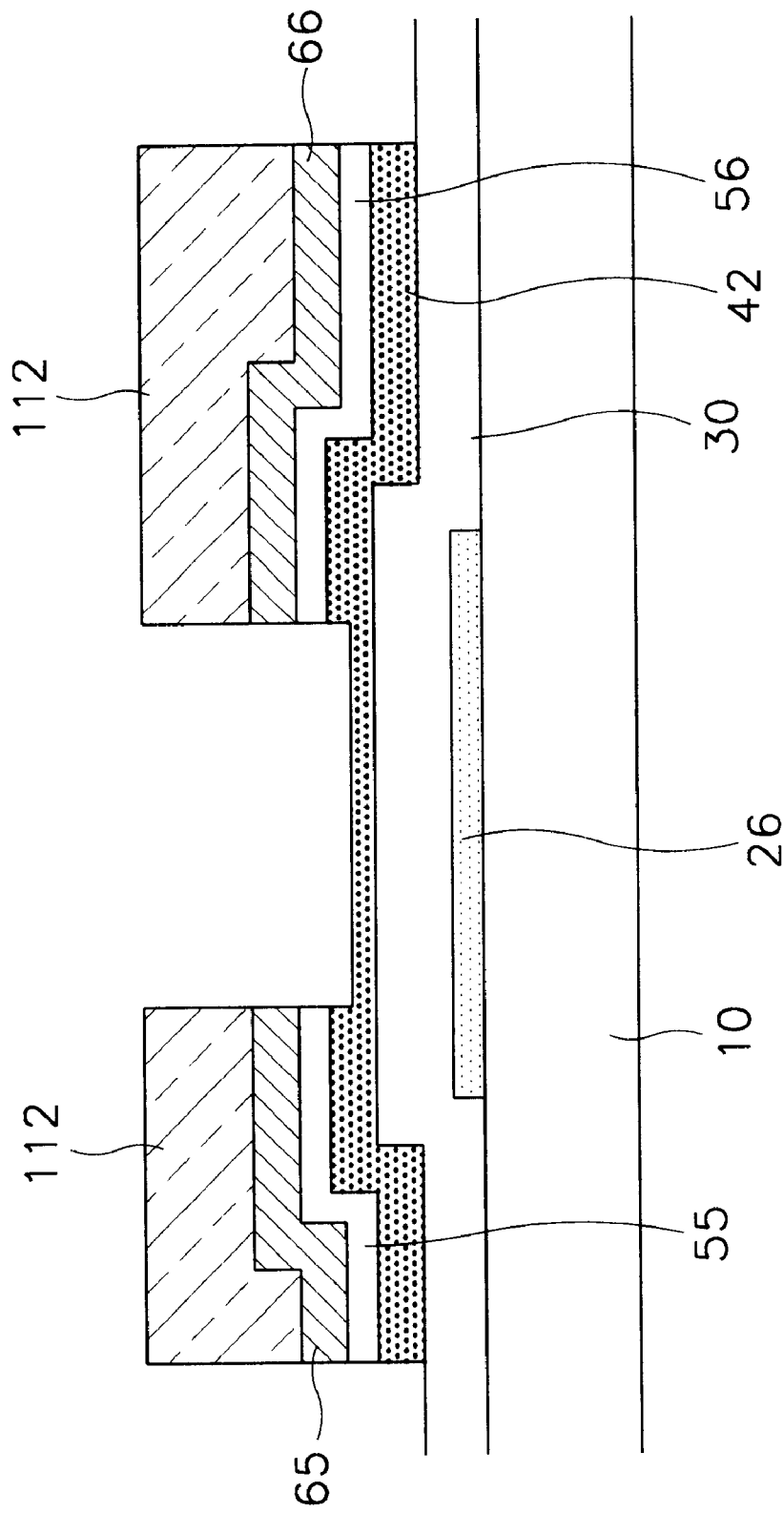

Thereafter, with reference to FIGS. 20A and 20B, the source/drain conducting pattern 67 and the source/drain intermediate layer pattern 57 are etched to remove the same. At this time, it is possible to perform a dry etch process to both the source/drain conducting pattern 67 and the intermediate layer pattern 57, or to perform wet etching for the source/drain conducting pattern 67 and dry etching for the intermediate layer pattern 57. In the case where dry etching is performed for both elements 67 and 57, it is preferable that an etch selection ratio of the source/drain conducting pattern 67 and the intermediate layer pattern 57 is large. If the etch selection ratio is not large, an etch completion point is not easily found such that it becomes difficult to control the thickness of the semiconductor pattern 42 remaining in the channel C. For example, the source/drain conducting pattern 67 may be etched using a mixture of $SF_6$ and $O_2$. In the case where both the wet etch and dry etch methods are used, although a side surface of the source/drain conducting pattern 67 is etched during wet etching, the intermediate layer pattern 57 undergoes almost no etching during the dry etch process. Accordingly, a stepped pattern results.

A mixture of $CF_4$ and HCl, or of $CF_4$ and $O_2$ may be used for the etching process. If the mixture of $CF_4$ and HCl is used, the semiconductor pattern 42 is left at a uniform thickness. At this time, with reference to FIG. 20B, a portion of the semiconductor pattern 42 may be removed, and the photosensitive layer pattern 112 may also undergo etching to a predetermined thickness. Etching at this point must be performed in such a manner that the gate insulation 30 is not etched. Also, it is preferable that the photosensitive material is such that the elements 62, 64, 65, 66 and 68 of the data wiring are not exposed when the photosensitive layer pattern 112 is etched.

As a result of the above process, the source electrodes 65 and the drain electrodes 66 are separated, and the elements 62, 64, 65, 66 and 68 of the data wiring and the contact layer patterns 55, 56 and 58 are completed. Lastly, the photosensitive layer pattern 112 remaining in the data wiring portion A is removed. The photosensitive layer pattern 112 may also be removed after the removal of the source/drain conducting pattern 67 of the channel C and before the removal of the intermediate layer pattern 57.

As described above, both wet etching and dry etching or only a dry etch process may be performed. In the latter case, although the process is simplified since only a single type of etching is performed, it may be difficult to satisfy all etch conditions. On the other hand, if both types of etching processes are used, etch conditions are satisfied but the etch process becomes more complicated.

Figure 21A:
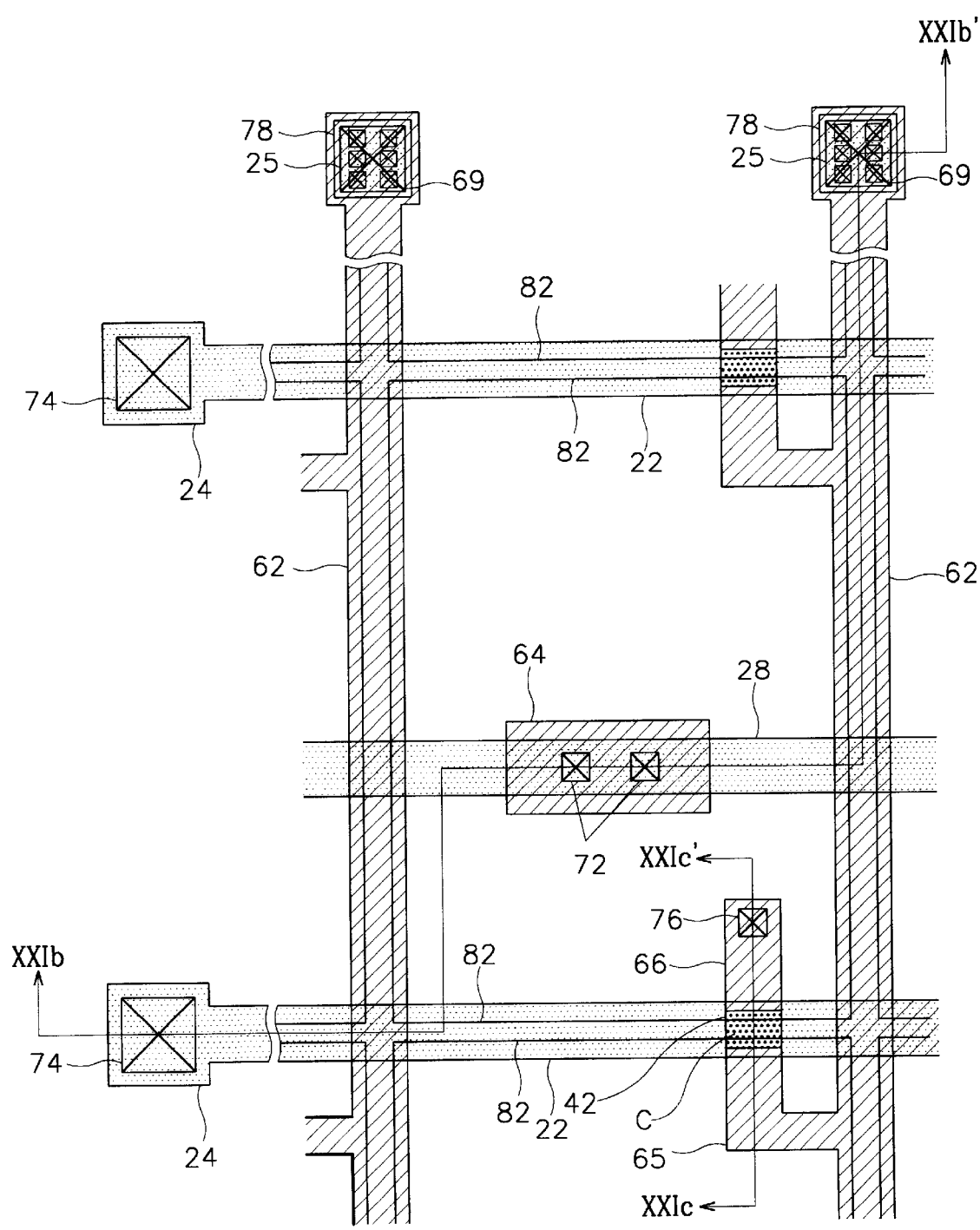
FIG. 21A is a schematic view of a thin film transistor substrate in a manufacturing step following that depicted in FIGS. 20A and 20B.
Figure 21B:
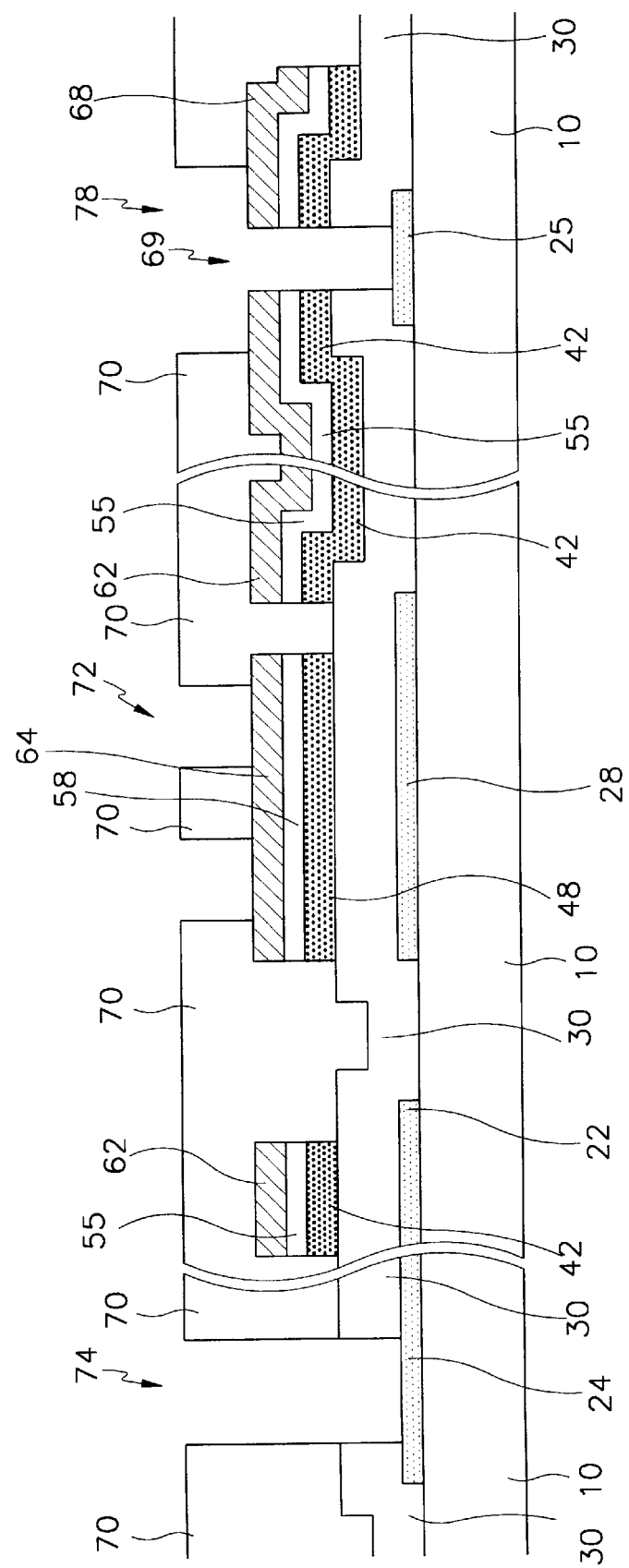

With reference to FIGS. 21A and 21C, after forming the elements 62, 64, 65, 66 and 68 of the data wiring, $SiNi_x$ is deposited through a CVD process to form the protection layer 70. Next, the protection layer 70 and the gate insulation layer 30 are etched to form the contact holes 76, 74, 78 and 72, which respectively expose the drain electrodes 66, the gate pads 24, the data pads 68 and the storage capacitor conducting pattern 64. Here, the gate insulation layer 30 exposed through the contact hole 69 of the data pad 68 is also removed such that the pad auxiliary layer 25, which is a low resistance aluminum group metal, is exposed through the contact holes 69 and 78. It is preferable that the protection layer 70 is deposited over an interval of 5 minutes or more at a temperature of at least 300° C. A portion or all of a high resistance metal oxide layer formed during the manufacturing process may be removed. It is preferable that an area of the contact holes 74 and 78 exposing the pads 24 and 68 does not exceed 2 mm×60 µm and is at least 0.5 mm×15 µm.

Finally, with reference to FIGS. 12 through 14, an IZO layer is deposited at a thickness of between 400 and 500 Å, and the layer is etched using a mask to form the pixel electrodes 82 connected to the drain electrodes 66 and the storage capacitor conducting pattern 64, the auxiliary gate pads 86 connected to the gate pads 24, and the auxiliary data pads 88 connected to the data pads 68 and the aluminum group pad auxiliary layer 25. The etch solution used for patterning at this time is a chrome etch solution, which is used for etching chrome metal layers. Chrome etch solutions do not corrode aluminum group metals and prevent the corrosion of aluminum group metals exposed in the contact structure. An example of such an etch solution is $HNO_3/(NH_4)_2Ce(NO_3)_6/H_2O$. It is preferable that a pre-heating process be performed before depositing the IZO layer. At this time, it is preferable that nitrogen be used to prevent the formation of a metal oxide layer on the layers 24, 25, 64, 66 and 68. Further, to minimize the contact resistance of the contact portions, it is preferable that the IZO layer be deposited in a temperature range of between room temperature and 200° C. Also, to form the IZO thin film, it is preferable that $In_2O_3$ and ZnO containing 15–20 at % of Zn are contained therein. Before depositing the IZO, to prevent the formation of $AlO_x$ on the aluminum group metal layer 24, a rinsing process using plasma containing oxygen, helium or argon may be performed in situ.

In the fourth embodiment of the present invention, in addition to the effects obtained in the first or third embodiments, the elements 62, 64, 65, 66 and 68 of the data wiring, as well as the contact layer patterns 55, 56 and 58 and the semiconductor patterns 42 and 48 are formed using a single mask. Also, in this process, the source electrodes 65 and the drain electrodes 66 are separated such that the manufacturing process is simplified.

In a manufacturing method for a thin film transistor substrate for LCDs in which four masks are used as in the first embodiment, the pad auxiliary layer may be formed on the same layer as the gate wiring such that the data pad portions are formed substantially in a flat shape, thereby increasing the contact area of the probe pin at the data pad portions. This will be described in more detail with reference to the drawings. Here, the majority of the structure is identical to the fourth preferred embodiment of the present invention. Accordingly, except for the pad portions, the remainder of the structure will not be described in detail and like reference numerals will be used for like elements.

Figure 22:
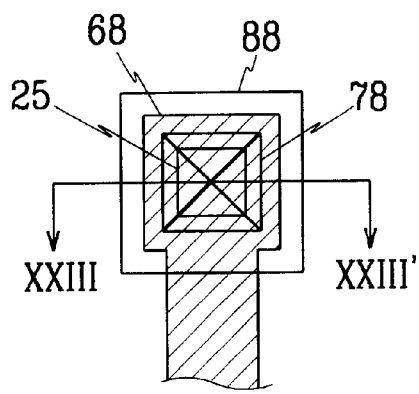
FIG. 22 is a schematic view of a data pad in a thin film transistor substrate for a liquid crystal display according to a fifth preferred embodiment of the present invention.
Figure 23:
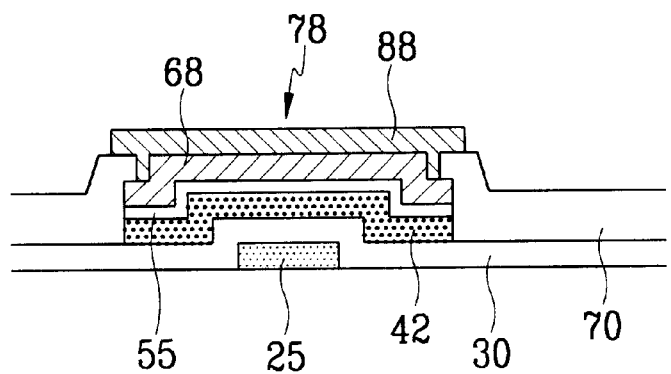
FIG. 23 is a sectional view taken along line XXIII–XIII' of FIG. 22.

And FIG. 22 is a schematic view of a data pad in a thin film transistor substrate for a liquid crystal display according to a fifth preferred embodiment of the present invention; and FIG. 23 is a sectional view taken along line XXIII–XIII' of FIG. 22.

As shown in the drawings, a gate insulation layer 30 is formed covering a pad auxiliary layer 25. Formed in sequence over the gate insulation layer 30 are a semiconductor pattern 42, an ohmic contact layer pattern 55, and a data pad 68. Further, a protection layer 70 is formed over the gate insulation layer 30, and has a contact hole 78 that exposes the data pad 68 and which is larger than the pad auxiliary layer 25. The protection layer 70 is made of $SiNi_x$ or an organic insulation material. An auxiliary data pad 88 made of a transparent conducting material is formed over the protection layer 70.

In the fifth embodiment, as with the second embodiment, the pad auxiliary layer 25 is provided under the data pad 68 to minimize the stepped formation of the protection layer 70. Accordingly, the auxiliary data pad 88 is formed nearly level on the protection layer 70. As a result of this structure, an area of the auxiliary data pad 88 contacted by the probe pin is increased such that a contact defect is prevented, and a contact resistance between these two elements is minimized.

In the present invention as described above, the pad portion contacted by the probe pin is either formed in a protruded shape, its area increased, or a low-resistance pad auxiliary layer added. As a result, when performing inspection of the LCD during the manufacturing process, contact defects of a probe pin and a contact resistance of the pad portions are minimized. Further, the reliability of the contact portions is ensured by limiting its contact resistance.

Although preferred embodiments of the present invention have been described in detail hereinabove, it should be clearly understood that many variations and/or modifications of the basic inventive concepts herein taught which may appear to those skilled in the present art will still fall within the spirit and scope of the present invention, as defined in the appended claims.

For example, although the structure of the data pad portions was changed in the above embodiments, it is also possible to vary the structure of the gate pad portions.

What is claimed is:

1. A thin film transistor substrate for a liquid crystal display, comprising:
   gate wiring fanned on an insulation substrate and including a gale electrode and a gate pad;
   a gate insulation layer covering said gate wiring;
   a semiconductor layer formed over said gate insulation layer;
   a source electrode and a drain electrode both overlying said semiconductor layer and said gate insulation layer;
   data wiring formed over said gate insulation layer and including a data pad, wherein the data pad includes a flat edge portion in contact with said gate insulation layer and a protruding central portion;
   a pad auxiliary layer formed on and in contact with said gate insulation layer, wherein a top surface and a side surface of said pad auxiliary layer are covered by the protruding central portion of the data pad;
   a protection layer formed over said data wiring and said gate insulation layer, and having a first contact hole exposing a portion of the gate pad and a second contact hole exposing the protruding central portion of said data pad, wherein said protection layer covers a portion of said flat edge portion of said data pad so as to form a gap between said protection layer and the protruding central portion of the data pad; and
   an auxiliary pad formed on and in contact with a top surface of the protruding central portion of the data pad and a top surface of said protection layer, wherein a lower portion of said auxiliary pad fills the gap,
   wherein the data pad, said source electrode and the drain electrode are formed from a same conductive layer.

2. The thin film transistor substrate of claim 1, wherein said pad auxiliary layer and said semiconductor layer are formed from a same semiconductor film.

3. The thin film transistor substrate of claim 1, wherein a gate auxiliary pad is connected to the gate pad through the first contact hole.

4. The thin film transistor substrate of claim 3, wherein the data wiring further includes a data line connected to the data pad and said source electrode.

5. The thin film transistor substrate of claim 4, further comprising a pixel electrode connected to the drain electrode.

6. The thin film transistor substrate of claim 5, further comprising a first ohmic contact layer formed between the semiconductor layer and said source electrode and between the semiconductor layer and the drain electrode, the first ohmic contact layer being doped with impurities at a high concentration.

7. The thin film transistor substrate of claim 6, further comprising a second ohmic contact layer between a top surface of the pad auxiliary layer and the protruding central portion of the date pad, wherein the first ohmic contact layer and the second ohmic layer are formed from a same thin semiconductor film.

8. The thin film transistor substrate of claim 7, wherein said semiconductor layer and said pad auxiliary layer are formed from a same semiconductor film.

9. The thin film transistor substrate of claim 8, wherein said auxiliary pad is made of IZO.

* * * * *

UNITED STATES PATENT AND TRADEMARK OFFICE
CERTIFICATE OF CORRECTION

PATENT NO. : 6,590,226 B2
DATED : July 8, 2003
INVENTOR(S) : Hyang-Shik Kong et al.

It is certified that error appears in the above-identified patent and that said Letters Patent is hereby corrected as shown below:

<u>Column 16,</u>
Line 9, change "fanned" to -- formed --.
Line 10, change "gale" to -- gate --.

Signed and Sealed this

Sixteenth Day of September, 2003

JAMES E. ROGAN
*Director of the United States Patent and Trademark Office*